(12) United States Patent
Ahn et al.

(10) Patent No.: US 7,316,784 B2
(45) Date of Patent: Jan. 8, 2008

(54) METHOD OF PATTERNING TRANSPARENT CONDUCTIVE FILM, THIN FILM TRANSISTOR SUBSTRATE USING THE SAME AND FABRICATING METHOD THEREOF

(75) Inventors: Byung Chul Ahn, Kyounggi-do (KR); Byoung Ho Lim, Kyoungsangbuk-do (KR); Byeong Dae Choi, Daegu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 130 days.

(21) Appl. No.: 10/774,701

(22) Filed: Feb. 10, 2004

(65) Prior Publication Data

US 2004/0195571 A1 Oct. 7, 2004

(30) Foreign Application Priority Data

Feb. 10, 2003 (KR) .................. 10-2003-0008159
Mar. 29, 2003 (KR) .................. 10-2003-0019782

(51) Int. Cl.
*H01L 21/302* (2006.01)

(52) U.S. Cl. .................. 216/23; 216/39; 216/40; 216/41; 216/49; 216/55; 216/100; 216/108; 438/30; 438/38; 438/951; 430/20; 257/E21.025; 257/E21.235

(58) Field of Classification Search .................. None
See application file for complete search history.

(56) References Cited

U.S. PATENT DOCUMENTS

| | | | |
|---|---|---|---|
| 6,407,782 B1 * | 6/2002 | Kim ........................... | 349/106 |
| 6,429,916 B1 * | 8/2002 | Nakata et al. .............. | 349/106 |
| 6,433,842 B1 * | 8/2002 | Kaneko et al. ............. | 349/43 |
| 6,743,476 B2 * | 6/2004 | Hishida ..................... | 427/271 |
| 6,912,024 B2 * | 6/2005 | Kim et al. .................. | 349/106 |
| 6,943,859 B2 * | 9/2005 | Yoo et al. .................. | 349/139 |
| 7,057,208 B2 * | 6/2006 | Akimoto et al. ............ | 257/59 |
| 2002/0070197 A1 * | 6/2002 | Ahn et al. ................... | 216/13 |
| 2003/0164911 A1 * | 9/2003 | Eguchi et al. ............. | 349/113 |
| 2003/0184688 A1 * | 10/2003 | Kim .......................... | 349/43 |
| 2004/0089900 A1 * | 5/2004 | Ishikawa et al. .......... | 257/347 |
| 2004/0104434 A1 * | 6/2004 | Lin ............................ | 257/347 |
| 2004/0195204 A1 * | 10/2004 | Ahn et al. ................... | 216/23 |
| 2004/0233361 A1 * | 11/2004 | Ha et al. .................... | 349/114 |
| 2004/0263707 A1 * | 12/2004 | Seo et al. ................... | 349/43 |

FOREIGN PATENT DOCUMENTS

| | | | |
|---|---|---|---|
| JP | 04112577 A | * | 4/1992 |
| JP | 09-293875 | | 11/1997 |
| KR | 1997-0023747 | | 5/1997 |
| KR | 10-2001-04024 | | 1/2001 |
| KR | 10-2001-0066262 A | | 7/2001 |

* cited by examiner

*Primary Examiner*—Anita K Alanko
(74) *Attorney, Agent, or Firm*—Morgan, Lewis & Bockius LLP

(57) ABSTRACT

A method of patterning a transparent conductive film adaptive for selectively etching a transparent conductive film without any mask processes, a thin film transistor for a display device using the same and a fabricating method thereof are disclosed. In the method of patterning the transparent conductive film, an inorganic material substrate is prepared. An organic material pattern is formed at a desired area of the inorganic material substrate. A thin film having a different crystallization rate depending upon said inorganic material and said organic material is formed. The thin film is selectively etched in accordance with said crystallization rate.

36 Claims, 50 Drawing Sheets

METHOD OF PATTERNING TRANSPARENT CONDUCTIVE FILM, THIN FILM TRANSISTOR SUBSTRATE USING THE SAME AND FABRICATING METHOD THEREOF

BACKGROUND OF THE INVENTION

1. Field of the Invention

The present invention relates to a display device and a fabricating method thereof, and more particularly to a method of patterning a transparent conductive film wherein the transparent conductive film can be selectively etched without using any masks. Also, the present invention is directed to a method of fabricating a display device that is capable of reducing the number of mask processes using said method of patterning the transparent conductive film.

2. Description of the Related Art

Generally, a liquid crystal display (LCD) controls light transmittance of a liquid crystal using an electric field to thereby display a picture. To this end, the LCD includes a liquid crystal panel having liquid crystal cells arranged in a matrix, and a driving circuit for driving the liquid crystal panel.

The liquid crystal display panel includes a thin film transistor substrate and a color filter substrate opposed to each other, a spacer positioned between two substrates so as to keep a constant cell gap, and a liquid crystal with which the cell gap is filled.

The thin film transistor substrate consists of gate lines and data lines, thin film transistors formed as a switching device for each intersection between the gate lines and the data lines, pixel electrodes formed for each liquid crystal cell and connected to the thin film transistor, and alignment films coated thereon. The gate lines and the data lines receive signals from the driving circuits via each pad portion. The thin film transistor applies a pixel voltage signal fed to the data line in response to a scanning signal fed to the scanning signal.

The color filter substrate consists of color filters formed for each liquid crystal cell, a black matrix for dividing color filters and reflecting an external light, a common electrode for commonly applying a reference voltage to the liquid crystal cells, and an alignment film coated thereon.

The liquid crystal display panel is completed by preparing the thin film array substrate and the color filter substrate individually to join them and then injecting a liquid crystal and sealing it.

In such a liquid crystal display panel, since the thin film transistor substrate involves a semiconductor process and requires a plurality of mask processes, the manufacturing process is complicate to be a major rise factor in the manufacturing cost of the liquid crystal display panel. In order to solve this, the thin film transistor substrate has been developed toward a reduction in the number of mask processes. This is because one mask process includes a lot of processes such as deposition, cleaning, photolithography, etching, photo-resist stripping and inspection processes, etc. Recently, there has been highlighted a four-mask process in which one mask process is reduced from the existent five-mask process that was a standard mask process.

FIG. 1 is a plan view illustrating a thin film transistor substrate adopting a four-mask process, and FIG. 2 is a section view of the thin film transistor substrate taken along the I-I' line in FIG. 1.

Referring to FIG. 1 and FIG. 2, the thin film transistor substrate includes a gate line 2 and a data line 4 provided on a lower substrate 42 in such a manner to intersect each other with having a gate insulating film 44 therebetween, a thin film transistor 6 provided at each intersection, and a pixel electrode 18 provided at a cell area having a crossing structure. Further, the thin film transistor substrate includes a storage capacitor 20 provided at an overlapped portion between the pixel electrode 18 and the pre-stage gate line 2, a gate pad portion 26 connected to the gate line 2, and a data pad portion 34 connected to the data line 4.

The thin film transistor 6 allows a pixel signal applied to the data line 4 to be charged into the pixel electrode 18 and be kept in response to a scanning signal applied to the gate line 2. To this end, the thin film transistor 6 includes a gate electrode 8 connected to the gate line 2, a source electrode 10 connected to the data line 4, a drain electrode 12 connected to the pixel electrode 16, and an active layer 14 overlapping with the gate electrode 8 and defining a channel between the source electrode 10 and the drain electrode 12.

The active layer 14 overlapping with the source electrode 10 and the drain electrode 12 and including a channel portion between the source electrode 10 and the drain electrode 12 also overlaps with the data pad lower electrode 36, the storage electrode 22 and the data line 4. On the active layer 14, an ohmic contact layer for making an ohmic contact with the data pad lower electrode 36, the storage electrode 22, the data line 4, the source electrode 10 and the drain electrode 12 is further provided.

The pixel electrode 18 is connected, via a first contact hole 16 passing through a protective film 50, to the drain electrode 12 of the thin film transistor 6. The pixel electrode 18 generates a potential difference with respect to a common electrode provided at an upper substrate (not shown) by the charged pixel signal. This potential difference rotates a liquid crystal positioned between the thin film transistor substrate and the upper substrate owing to a dielectric anisotropy and transmits a light inputted, via the pixel electrode 18, from a light source (not shown) toward the upper substrate.

The storage capacitor 20 consists of a pre-stage gate line 2, a storage electrode 22 overlapping with the gate line with having the gate insulating film 44, the active layer 14 and the ohmic contact layer 48 therebetween, and a pixel electrode 18 overlapping with the storage electrode 22 with having the protective film 50 therebetween and connected via a second contact hole 24 provided in the protective film 50. The storage capacitor 20 allows a pixel signal charged in the pixel electrode 18 to be maintained stably until the next pixel signal is charged.

The gate line 2 is connected, via the gate pad portion 26, to a gate driver (not shown). The gate pad portion 26 consists of a gate pad lower electrode 28 extended from the gate line 2, and a gate pad upper electrode 32 connected, via a third contact hole 30 passing through the gate insulating film 44 and the protective film 50, to the gate pad lower electrode 28.

The data line 4 is connected, via the data pad portion 34, to the data driver (not shown). The data pad portion 34 consists of a data pad lower electrode 36 extended from the data line 4, and a data pad upper electrode 40 connected, via a fourth contact hole 38 passing through the protective film 50, to the data pad lower electrode 36.

Hereinafter, a method of fabricating the thin film transistor substrate having the above-mentioned structure adopting the four-round mask process will be described in detail with reference to FIG. 3A to FIG. 3D.

Referring to FIG. 3A, gate metal patterns including the gate line 2, the gate electrode 8 and the gate pad lower electrode 28 are provided on the lower substrate 42 using the first mask process.

More specifically, a gate metal layer is formed on the upper substrate 42 by a deposition technique such as a sputtering. Then, the gate metal layer is patterned by the photolithography and the etching process employing a first mask to thereby form the gate metal patterns including the gate line 2, the gate electrode 8 and the gate pad lower electrode 28. The gate metal has a single-layer or double-layer structure of chrome (Cr), molybdenum (Mo) or an aluminum group metal, etc.

Referring to FIG. 3B, the gate insulating film 44 is coated onto the lower substrate 42 provided with the gate metal patterns. Further, semiconductor patterns including the active layer 14 and the ohmic contact layer 48 and source/drain metal patterns including the data line 4, the source electrode 10, the drain electrode 12, the data pad lower electrode 36 and the storage electrode 22 are sequentially formed on the gate insulating film 44 using the second mask process.

More specifically, the gate insulating film 44, an amorphous silicon layer, a $n^+$ amorphous silicon layer and a source/drain metal layer are sequentially provided on the lower substrate 42 provided with the gate patterns by deposition techniques such as the plasma enhanced chemical vapor deposition (PECVD) and the sputtering, etc. Herein, The gate insulating film 44 is made from an inorganic insulating material such as silicon nitride ($SiN_x$) or silicon oxide ($SiO_x$). The source/drain metal is made from molybdenum (Mo), titanium (Ti), tantalum (Ta) or a molybdenum alloy, etc.

Then, a photo-resist pattern is formed on the source/drain metal layer by the photolithography using a second mask. In this case, a diffractive exposure mask having a diffractive exposing part at a channel portion of the thin film transistor is used as a second mask, thereby allowing a photo-resist pattern of the channel portion to have a lower height than other source/drain pattern portion.

Subsequently, the source/drain metal layer is patterned by a wet etching process using the photo-resist pattern to thereby provide the source/drain metal patterns including the data line 4, the source electrode 10, the drain electrode 12 being integral to the source electrode 10 and the storage electrode 22.

Next, the $n^+$ amorphous silicon layer and the amorphous silicon layer are patterned at the same time by a dry etching process using the same photo-resist pattern to thereby provide the ohmic contact layer 48 and the active layer 14. The photo-resist pattern having a relatively low height is removed from the channel portion by the ashing process and thereafter the source/drain metal pattern and the ohmic contact layer 48 of the channel portion are etched by the dry etching process. Thus, the active layer 14 of the channel portion is exposed to disconnect the source electrode 10 from the drain electrode 12.

Then, the photo-resist pattern left on the source/drain pattern is removed by the stripping process.

Referring to FIG. 3C, the protective film 50 including the first and fourth contact holes 16, 24, 30 and 38 are formed on the gate insulating film 44 provided with the source/drain metal patterns using the third mask process.

More specifically, the protective film 50 is entirely provided on the gate insulating film 44 provided with the source/drain metal patterns by a deposition technique such as the plasma enhanced chemical vapor deposition (PECVD). The protective film 50 is patterned by the photolithography and the etching process using the third mask to thereby define the first to fourth contact holes 16, 24, 30 and 38. The first contact hole 16 is formed in such a manner to pass through the protective film 50 and expose the drain electrode 12, whereas the second contact hole 24 is formed in such a manner to pass through the protective film 50 and expose the storage electrode 22. The third contact hole 30 is formed in such a manner to pass through the protective film 50 and the gate insulating film 44 and expose the gate pad lower electrode 28. The fourth contact hole 38 is formed in such a manner to pass through the protective film 50 and expose the data pad lower electrode 36.

The protective film 50 is made from an inorganic material identical to the gate insulating film 44 or an organic material having a small dielectric constant such as an acrylic organic compound, BCB (benzocyclobutene) or PFCB (perfluorocyclobutane), etc.

Referring to FIG. 3D, transparent conductive film patterns including the pixel electrode 18, the gate pad upper electrode 32 and the data pad upper electrode 40 are provided on the protective film 50 using the fourth mask process.

A transparent conductive film is coated onto the protective film 50 by a deposition technique such as the sputtering, etc. Then, the transparent conductive film is patterned by the photolithography and the etching process using a fourth mask to thereby provide the transparent conductive film patterns including the pixel electrode 18, the gate pad upper electrode 32 and the data pad upper electrode 40. The pixel electrode 18 is electrically connected, via the first contact hole 16, to the drain electrode 12 while being electrically connected, via the second contact hole 24, to the storage electrode 22 overlapping with the pre-stage gate line 2. The gate pad upper electrode 32 is electrically connected, via the third contact hole 30, to the gate pad lower electrode 28. The data pad upper electrode 40 is electrically connected, via the fourth contact hole 38, to the data pad lower electrode 36. Herein, the transparent conductive film is formed from indium-tin-oxide (ITO), tin-oxide (TO) or indium-zinc-oxide (IZO).

As described above, the conventional thin film transistor substrate and the manufacturing method thereof adopts a four-round mask process, thereby reducing the number of manufacturing processes in comparison to the five-round mask process and hence reducing a manufacturing cost to that extent. However, since the four-round mask process also still has a complex manufacturing cost and a limit in reducing a cost, there has been required a novel thin film transistor substrate and a novel manufacturing method thereof that is capable of more simplifying the manufacturing process and more reducing the manufacturing cost than the prior art.

SUMMARY OF THE INVENTION

Accordingly, it is an object of the present invention to provide a method of patterning a transparent conductive film wherein the transparent conductive film can be selectively etched without any mask processes and a display device using the same.

A further object of the present invention is to provide a method of patterning a transparent conductive film wherein a crystallization difference of the transparent conductive film can be more enlarged to thereby enhance a stability of a selective etching process for the transparent conductive film and a display device using the same.

A still further object of the present invention is to provide a thin film transistor substrate for a display device wherein the structure and process of the thin film transistor substrate can be simplified by adopting the above-mentioned method of patterning the transparent conductive film.

In order to achieve these and other objects of the invention, a thin film patterning method according to one aspect of the present invention includes a first step of preparing an inorganic material substrate; a second step of forming an organic material pattern at a desired area of the inorganic material substrate; a third step of forming a thin film having a different crystallization rate depending upon said inorganic material and said organic material; and a fourth step of selectively etching the thin film in accordance with said crystallization rate.

In the thin film patterning method, said third step includes forming a transparent conductive film having a different binding structure depending upon a type of said material.

Herein, said step of forming the transparent conductive film includes forming the transparent conductive film on the inorganic material substrate while heating the inorganic material substrate at a temperature range of about 100° C. to 200° C.

Said transparent conductive film is formed into an amorphous substance on the inorganic material substrate while being formed a crystalline substance on the organic material pattern.

Said fourth step includes selectively etching out the amorphous transparent conductive film on the organic material pattern using an etchant for amorphous substance.

The thin film patterning method further includes a step of forming a crystallization catalyst layer at the remaining area excluding an area where the organic material pattern is formed, between said second step and said third step, so as to accelerate a crystallization of the thin film.

Herein, said crystallization catalyst layer includes at least one of refractory metals such as Ni, Cu, In, Sn, Mo, Tn, W, Cr and Hf.

Said crystallization catalyst layer is formed such that atoms of said metals has a distribution scattered on a sparsely basis.

Said second step includes entirely forming the organic film on the inorganic material substrate; and patterning the organic film by an etching process using a photo-resist pattern formed by the photolithography.

Herein, said step of forming the crystallization catalyst layer includes entirely forming the crystallization catalyst layer on said substrate in which the photo-resist pattern is formed on the organic material pattern; and removing the crystallization catalyst layer on the photo-resist pattern along with the photo-resist pattern.

A method of patterning a transparent conductive film according to another aspect of the present invention includes a first step of preparing an inorganic material substrate; a second step of forming an organic film on said substrate; and a third step of forming a transparent conductive film making an interface with the organic film on a substrate at the remaining area including an area where the organic film is formed.

In the method, said second step includes entirely forming the organic film on said substrate; and patterning the organic film by an etching process using a photo-resist pattern formed by the photolithography.

Said third step includes entirely forming the transparent conductive film on said substrate on which the organic film is formed; and selectively etching the transparent conductive film on the organic film depending upon a crystallization rate of the transparent conductive film.

Herein, said step of forming the transparent conductive film includes entirely forming the transparent conductive film while heating said substrate at a temperature range of about 100° C. to 200° C.

Said transparent conductive film is formed into an amorphous substance on the inorganic material substrate while being formed a crystalline substance on the organic film.

Said step of selectively etching the transparent conductive film includes selectively etching out the amorphous transparent conductive film on the organic film using an etchant for amorphous substance.

Herein, an etching ratio of the amorphous transparent conductive film to the crystalline transparent conductive film is controlled by differentiating a content of an oxalic acid contained in the etchant for amorphous substance.

Said transparent conductive film is formed to have a thickness of about 500 Å (angstroms) or less.

Said transparent conductive film is formed from at least one of ITO, TO, IZO and SnO2.

The method further includes a step of forming a crystallization catalyst layer on the inorganic material substrate at the remaining area excluding an area where the organic film is formed, between said second step and said third step, so as to accelerate a crystallization of the transparent conductive film.

Herein, said crystallization catalyst layer includes at least one of refractory metals such as Ni, Cu, In, Sn, Mo, Tn, W, Cr and Hf.

Said crystallization catalyst layer is formed such that atoms of said metals has a distribution scattered on a sparsely basis.

Said step of forming the crystallization catalyst layer includes entirely forming the crystallization catalyst layer on said substrate in which the photo-resist pattern is formed on the organic film; and removing the crystallization catalyst layer on the photo-resist pattern along with the photo-resist pattern.

A display device having a transparent conductive film according to still another aspect of the present invention includes a substrate; an organic film formed at a desired area of the substrate; and a transparent conductive film formed at the remaining area including an area where the organic film is formed in such a manner to make an interface with the organic film.

In the display device, said substrate is formed from an inorganic material.

The transparent conductive film formed on the inorganic material substrate has a crystalline structure.

Said transparent conductive film is formed to have a thickness of about 500 Å (angstroms) or less.

Said transparent conductive film is formed from at least one of ITO, TO, IZO and SnO2.

The display device further includes a crystallization catalyst layer formed at the remaining area excluding an area where the organic film is formed so as to accelerate a crystallization of the transparent conductive film.

Herein, said crystallization catalyst layer is formed such that metal atoms of at least one of refractory metals such as Ni, Cu, In, Sn, Mo, Tn, W, Cr and Hf have a distribution scattered on a sparsely basis.

A thin film transistor substrate for a display device according to still another aspect of the present invention includes a gate line; a data line crossing the gate line with having a gate insulating film therebetween to define a pixel area; a thin film transistor formed at an intersection between the gate line and the data line; a protective film covering the gate line, the data line and the thin film transistor except for said pixel area; and a pixel electrode formed at said pixel area in such a manner to make an interface with the protective film and connected to the thin film transistor.

In the thin film transistor substrate, said protective film is any one of an organic insulating film, an inorganic insulating film and an inorganic/organic insulating film having a double-layer structure.

Said pixel electrode is formed to cover an area until the side surface of the protective film when the protective film includes the inorganic insulating film.

The thin film transistor substrate further includes a semiconductor layer formed along the data line on the gate insulating film to be included in the thin film transistor.

The thin film transistor substrate further includes a gate pad lower electrode formed from the same material as the gate line; a contact hole passing through the protective film and the gate insulating film to expose the gate pad lower electrode; and a gate pad portion formed from the same material as the pixel electrode and including a gate pad upper electrode connected to the gate pad lower electrode through the contact hole.

Herein, the gate pad upper electrode makes an interface with the protective film.

Said gate pad upper electrode is coated onto the side surface of the inorganic insulating film when the protective film includes the inorganic insulating film.

The thin film transistor substrate further includes a data pad lower electrode formed from the same material as the data line; a contact hole passing through the protective film to expose the data pad lower electrode; and a data pad portion formed from the same material as the pixel electrode and including a data pad upper electrode connected to the data pad lower electrode through the contact hole.

Herein, the data pad upper electrode makes an interface with the protective film.

Said data pad upper electrode is coated onto the side surface of the inorganic insulating film when the protective film includes the inorganic insulating film.

Said contact hole passes through the data pad lower electrode, and said data pad upper electrode makes a side contact with the data pad lower electrode through said contact hole.

The thin film transistor substrate further includes a storage lower electrode made by a portion of the gate line; and a storage capacitor formed from the same material as the data line on the gate insulating film in such a manner to overlap with the storage lower electrode and including a storage upper electrode making a side contact with the pixel electrode.

Said organic insulating film is formed from at least one of an acrylic organic compound, BCB and PFCB.

Said pixel electrode is formed to have a thickness of about 500 Å (angstroms) or less.

Said pixel electrode is formed from at least one of ITO, TO, IZO and SnO2.

Said pixel electrode makes a side contact with a drain electrode of the thin film transistor protruded toward said pixel area.

The thin film transistor substrate further includes a crystallization catalyst layer formed at the lower portion of the pixel electrode positioned at the remaining area excluding an area where the organic film is formed.

Herein, said crystallization catalyst layer is formed such that metal atoms of at least one of refractory metals such as Ni, Cu, In, Sn, Mo, Tn, W, Cr and Hf have a distribution scattered on a sparsely basis.

A method of fabricating a thin film transistor substrate for a display device according to still another aspect of the present invention includes a first step of forming a gate line on a substrate; a second step of forming a gate insulating film covering the gate line; a third step of forming a semiconductor layer at a desired area on the gate insulating film; a fourth step of forming a data line crossing the gate line, a source electrode connected to the data line and a drain electrode opposed to the source electrode on the gate insulating film; a fifth step of forming a protective film in such a manner to cover the gate line, the data line, the source electrode and the drain electrode; and a sixth step of forming a pixel electrode making an interface with the protective film at the remaining area excluding an area where the protective film is formed and connected to the drain electrode.

The method further includes the steps of providing a gate pad lower electrode formed from the same material as the gate line; providing a contact hole passing through the protective film and the gate insulating film to expose the gate pad lower electrode; and providing a gate pad upper electrode formed from the same material as the pixel electrode and connected to the gate pad lower electrode through said contact hole.

The method further includes the steps of providing a data pad lower electrode formed from the same material as the data line on the gate insulating film; providing a contact hole passing through the protective film to expose the data pad lower electrode; and providing a data pad upper electrode formed from the same material as the pixel electrode and connected to the data pad lower electrode through said contact hole.

The method further includes the step of providing a storage upper electrode formed from the same material as the data line on the gate insulating film in such a manner to overlap with a portion of the gate line and making a side contact with the pixel electrode.

Said protective film is any one of an organic insulating film, an inorganic insulating film and an inorganic/organic insulating film having a double-layer structure.

Said sixth step includes coating the transparent conductive film formed into an amorphous substance on the protective film including an organic material while being formed into a crystalline substance at the remaining area formed from an inorganic material; and selectively etching the amorphous transparent conductive film on the protective film using an etchant for amorphous substance to thereby leave only the crystalline transparent conductive film.

The method further includes a step of forming a crystallization catalyst layer at the remaining area excluding an area where the protective film is formed between said fifth step and said sixth step.

Said fifth step includes entirely forming the protective film on said substrate; and patterning the protective film by an etching process using a photo-resist pattern formed by the photolithography.

Said step of forming the crystallization catalyst layer includes entirely forming the crystallization catalyst layer on said substrate in which the photo-resist pattern is formed on the protective film; and removing the crystallization catalyst layer on the photo-resist pattern along with the photo-resist pattern.

Said crystallization catalyst layer is formed such that metal atoms of at least one of refractory metals such as Ni, Cu, In, Sn, Mo, Tn, W, Cr and Hf have a distribution scattered on a sparsely basis.

A method of fabricating a thin film transistor substrate for a display device according to still another aspect of the present invention includes a first mask process of forming a gate line using a first mask after forming a gate metal layer on a substrate; a process of disposing a gate insulating film, an amorphous silicon layer, an amorphous silicon layer doped with an impurity and a source/drain metal layer; a second mask process of patterning the source/drain metal layer, the amorphous silicon layer doped with said impurity and the amorphous silicon layer using a second mask to thereby provide a data line, a source electrode, a drain electrode and a semiconductor layer; a third mask process of etching out a protective film at a pixel area defined by an intersection between the gate line and the data line and the gate insulating film using a third mask after forming the protective film; and a process of selectively etching out a transparent conductive film on the protective film after forming the transparent conductive film to thereby provide a pixel electrode making an interface with the protective film and connected to the drain electrode.

In the method, said second mask process includes forming a photo-resist pattern having a different thickness on a source/drain metal layer using said partially-transmitting mask; patterning the source/drain metal layer, the amorphous silicon layer doped with said impurity and the amorphous silicon layer using the photo-resist pattern to thereby provide the data line, the drain electrode integral to the source electrode and the semiconductor layer; ashing the photo-resist pattern to remove a relatively thin photo-resist pattern; disconnecting the source electrode from the drain electrode through a portion at which said thin photo-resist pattern is removed and removing the amorphous silicon layer doped with said impurity; and removing the remaining photo-resist pattern.

The method further includes the steps of providing a gate pad lower electrode formed from the same material as the gate line by the first mask process; providing a contact hole passing through the protective film and the gate insulating film to expose the gate pad lower electrode by the third mask process; and providing a gate pad upper electrode formed from the same material as the pixel electrode and connected to the gate pad lower electrode through said contact hole.

The method further includes the steps of providing a data pad lower electrode formed from the same material as the data line on the gate insulating film by the second mask process; providing a contact hole passing through the protective film to expose the data pad lower electrode; and providing a data pad upper electrode formed from the same material as the pixel electrode and connected to the data pad lower electrode through said contact hole.

The method further includes the step of providing a storage upper electrode formed from the same material as the data line on the gate insulating film in such a manner to overlap with a portion of the gate line and making a side contact with the pixel electrode by the second mask process.

Said protective film is formed from an organic insulating film.

Alternatively, said protective film is formed from an inorganic insulating film.

Said pixel electrode is formed to cover an area until the side surface of the inorganic insulating film.

Said protective film is formed from a double layer of an inorganic insulating film and an organic insulating film.

Said pixel electrode is formed to cover an area until the side surface of the inorganic insulating film.

Said gate pad upper electrode makes an interface with the protective film.

Said gate pad upper electrode is coated onto the side surface of the inorganic insulating film when the protective film includes the inorganic insulating film.

Said data pad upper electrode makes an interface with the protective film.

Said data pad upper electrode is coated onto the side surface of the inorganic insulating film when the protective film includes the inorganic insulating film.

Said contact hole is formed to pass through the data pad lower electrode such that the data pad upper electrode makes a side contact with the data pad lower electrode.

Said step of forming the pixel electrode includes coating the transparent conductive film formed into an amorphous substance on the protective film including an organic material while being formed into at the remaining area formed from an inorganic material; and selectively etching the amorphous transparent conductive film on the protective film using an etchant for amorphous substance to thereby leave only the crystalline transparent conductive film.

Herein, the protective film including said organic material is formed from at least one of an acrylic organic compound, BCB and PFCB.

The method further includes the step of removing the organic material protective film making an interface with the crystalline transparent conductive film when the protective film is a built layer of the inorganic material protective film and the organic material protective film.

Herein, said organic material protective film is made from an organic material including a photosensitive resin.

The method further includes the step of heating the substrate on which the protective film is formed at a temperature range of about 100° C. to 200° C. while coating the transparent conductive film.

Said transparent conductive film is formed to have a thickness of about 500 Å (angstroms) or less.

Said pixel electrode is formed from at least one of ITO, TO, IZO and SnO2.

An etching ratio of the amorphous transparent conductive film to the crystalline transparent conductive film is controlled by differentiating a content of an oxalic acid contained in the etchant for amorphous substance.

Said etchant for amorphous substance contains an oxalic acid at a range of 3 to 5 weight %.

Said pixel electrode makes a side contact with the drain electrode protruded toward said pixel area.

The method further includes the step of forming a crystallization catalyst layer at the remaining area excluding an area where the protective film is formed between said second mask process and said third mask process.

Herein, said step of forming the protective film includes entirely forming the protective film on said substrate; and patterning the protective film by an etching process using a photo-resist pattern formed by the photolithography.

Said step of forming the crystallization catalyst layer includes entirely forming the crystallization catalyst layer on said substrate in which the photo-resist-pattern is formed on the protective film; and removing the crystallization catalyst layer on the photo-resist pattern along with the photo-resist pattern.

Said crystallization catalyst layer is formed such that metal atoms of at least one of refractory metals such as Ni, Cu, In, Sn, Mo, Tn, W, Cr and Hf have a distribution scattered on a sparsely basis.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Figure 1:
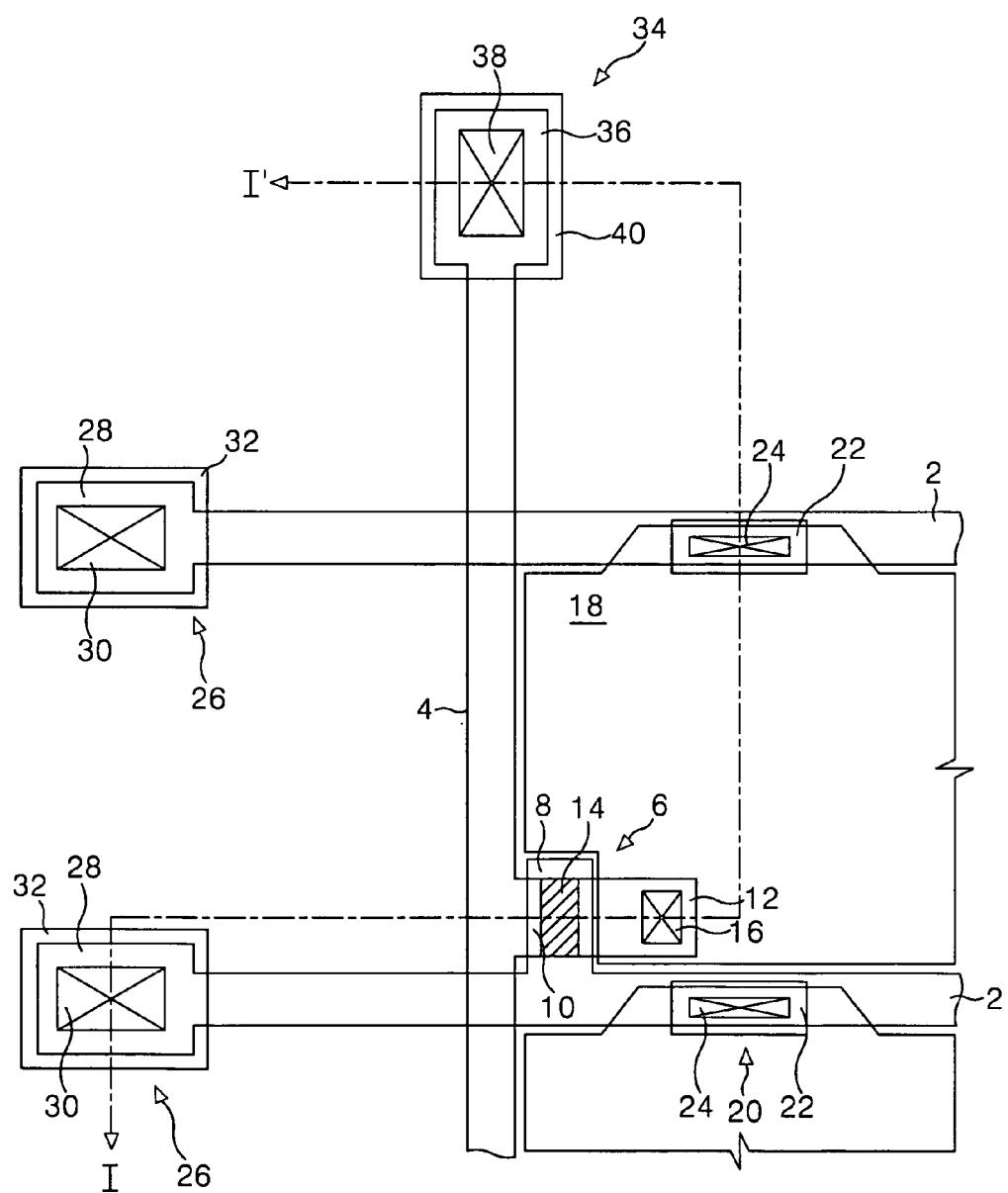
FIG. 1 is a plan view showing a portion of a thin film transistor substrate included in a conventional liquid crystal display.
Figure 2:
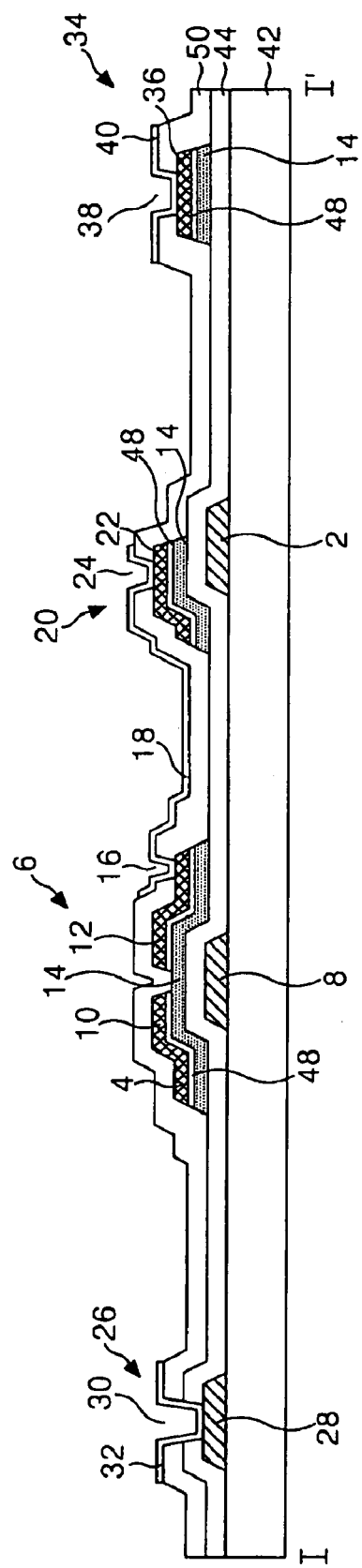
FIG. 2 is a section view of the thin film transistor substrate taken along the I-I' line in FIG. 1.
Figure 3A:
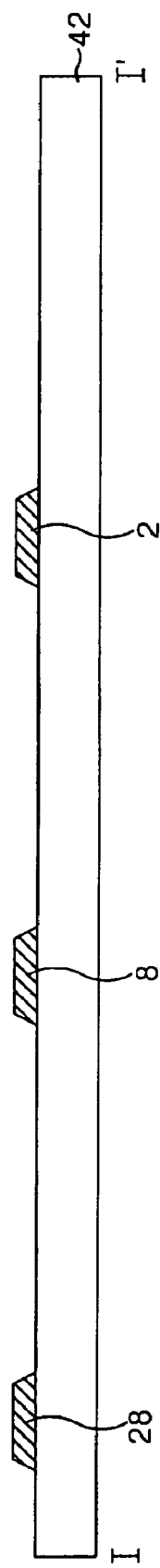
FIG. 3A to FIG. 3D are section views illustrating a method of manufacturing the thin film transistor substrate shown in FIG. 2 step by step.
Figure 3B:
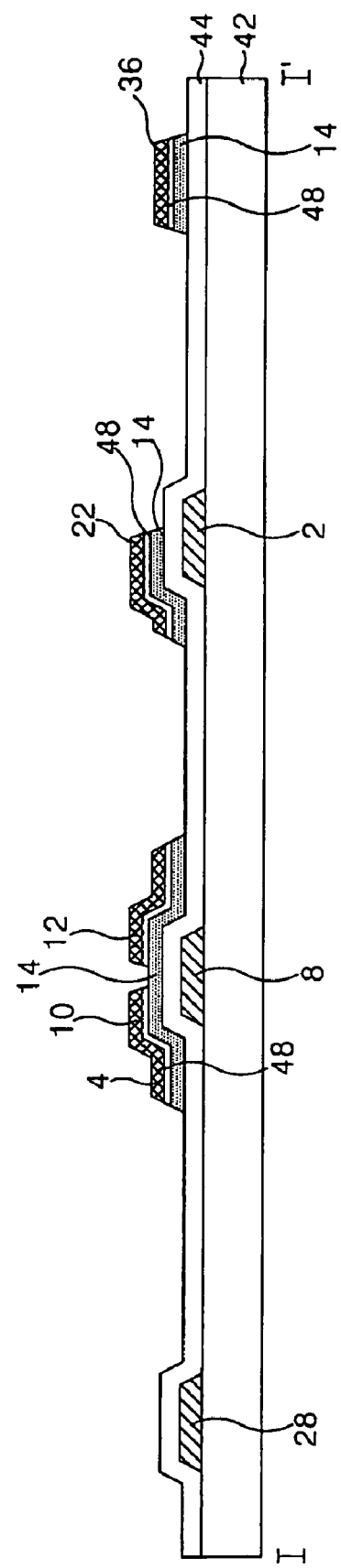
Figure 3C:
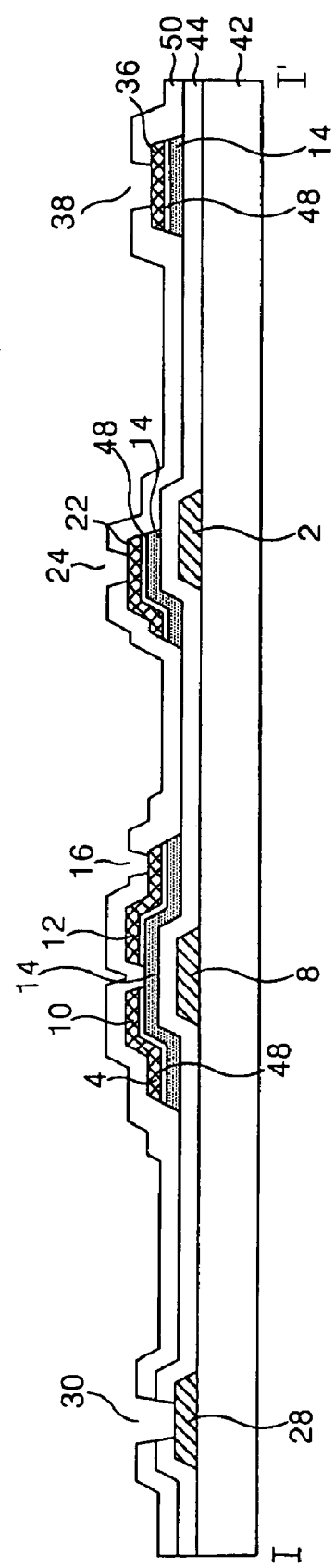
Figure 3D:
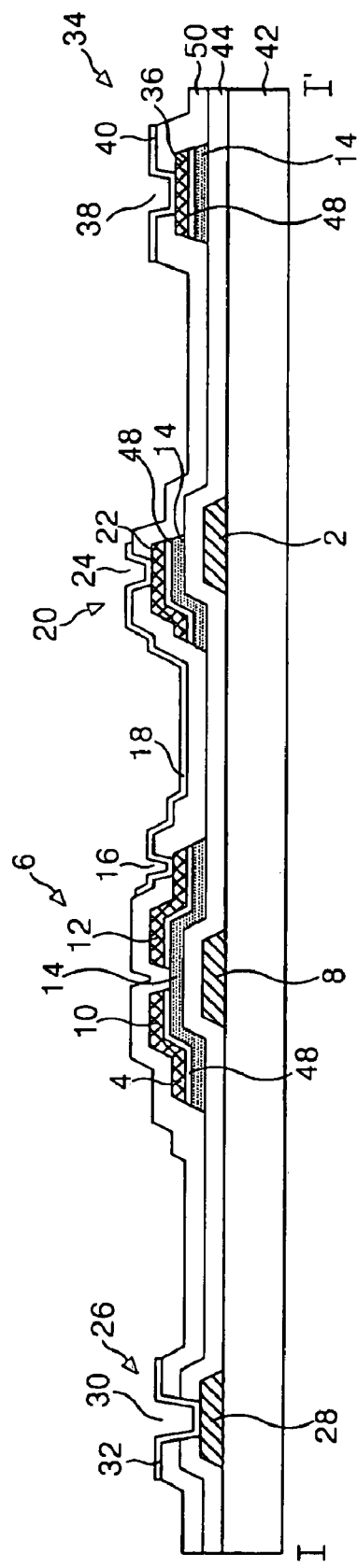
Figure 4A:
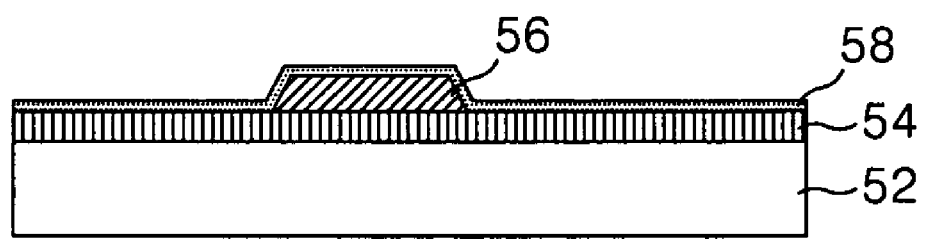
FIG. 4A to FIG. 4C are section views for explaining a method of patterning a transparent conductive film according to an embodiment of the present invention step by step.
Figure 4B:
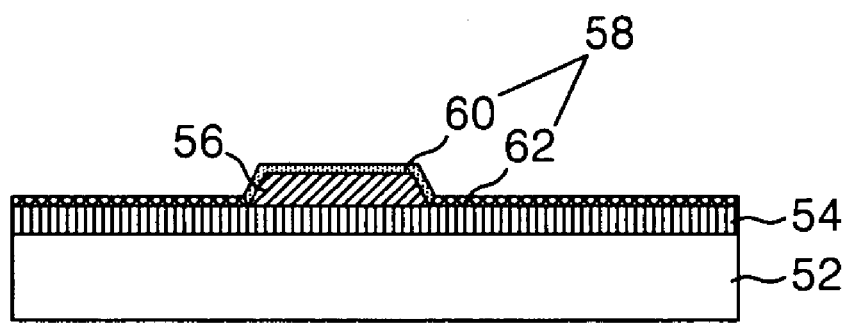
Figure 4C:
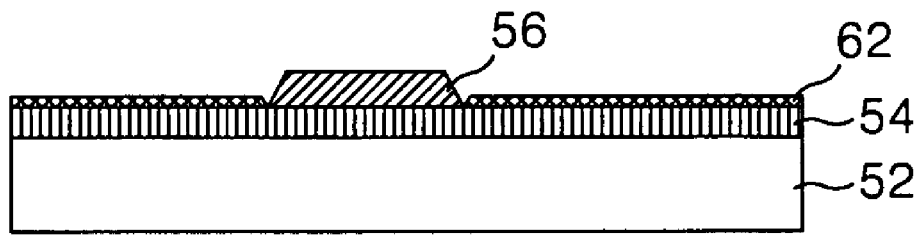

FIG. 4A to FIG. 4C are section views for explaining a method of patterning a transparent conductive film according to an embodiment of the present invention step by step.

Referring to FIG. 4A, an inorganic film 54 is formed on a substrate 52 and an organic film 56 is formed on a specific area of the inorganic film 54. The organic film 56 is provided by entirely depositing an organic material onto the inorganic film 54 and then patterning it using a mask process. A transparent conductive film 58 is deposited onto the inorganic film 54 on which the organic film 56 has been formed.

Particularly, when the transparent conductive film 58 is formed while the substrate being heated at more than about 180° C., the transparent conductive film 58 is divided into an amorphous transparent conductive film 60 formed on the organic film 56 and a crystalline transparent conductive film 62 formed on the inorganic film 54 as shown in FIG. 4B. This exploits a fact that a thin film is grown into an amorphous substance, an amorphous plus crystalline substance or a crystalline substance depending upon its condition. This is because a crystallization ratio is differentiated due to a different growing condition between the transparent conductive film 58 on the inorganic film 54 and the transparent conductive film 58 on the organic film 56.

More specifically, the transparent conductive film 58 is grown into an amorphous substance from the normal temperature until a substrate temperature of about 180° C. while being grown into a temperature higher than the substrate temperature. Also, when the substrate temperature satisfies a condition growing into an amorphous substance, the transparent conductive film 58 is grown into an amorphous substance (or amorphous plus crystalline substance) and a crystalline substance depending upon a material of the substrate. In other words, the transparent conductive film 58 on the inorganic film 54 having a substrate temperature of about 180° C. or more is grown into a crystalline substance while the transparent conductive material on the organic film 56 is grown into an amorphous substance. This results from a fact that the inorganic film 54 is easy to make a seed formation for a crystalline growth and thus causes a high crystallization ratio of the transparent conductive film 58 while the organic film 56 contains a relatively lot of hydrogen (H) radical preventing a seed formation for a crystalline growth and a low crystallization ratio of the transparent conductive film 58.

Furthermore, the transparent conductive film 58 is grown into an amorphous substance and a crystalline substance depending upon its thickness when it is formed on the organic film 56. For example, the transparent conductive film 58 on the inorganic film 56 is grown into an amorphous substance until a thickness of about 500 Å (angstroms) or less while being grown into a crystalline substance from a thickness of about 500 Å (angstroms) or more. Thus, the transparent conductive film 58 must be formed at a thickness of about 500 Å (angstroms) or less so as to have an amorphous structure on the organic film 56.

The transparent conductive film 58 grown into an amorphous substance and a crystalline substance at a different crystallization ratio depending upon a growth condition is formed from indium-tin-oxide (ITO), tin-oxide (TO), indium-zinc-oxide (IZO) or SnO2, etc.

Further, the transparent conductive film 58 is selectively etched by an etchant for amorphous substance, to thereby be patterned in such a manner to left a crystalline transparent conductive film 62 as shown in FIG. 4C. For example, an amorphous transparent conductive film 60 on the organic film 56 is selectively etched out by a wet etching process using an etchant for amorphous substance based on an oxalic acid (C2H2O4) while the crystalline transparent conductive film 62 on the inorganic film 54 is left. This results from a fact that the amorphous transparent conductive film 60 has an etching ratio different from the crystalline transparent conductive film 62 with respect to an etchant for amorphous substance. For example, an etching selection ratio sufficient to the process can be obtained from a thin oxalic acid of 10% or less. Particularly, the amorphous transparent conductive film 60 has an etching rate difference of more than about ten times from the crystalline transparent conductive film 62 with respect to an etchant for amorphous substance containing a 3 to 5 weight % oxalic acid.

Since the amorphous transparent conductive film 60 on the organic film 56 is entirely etched by such an amorphous etchant, the crystalline transparent conductive film 62 left on the inorganic film 54 makes an interface with the organic film 56 without any overlaps as shown in FIG. 4C.

Moreover, the method of patterning the transparent conductive film according to the embodiment of the present invention makes use of a crystallization catalyst, as will be described below, so as to accelerate a crystallization of the crystalline transparent conductive film 62 formed on the inorganic film 54.

Figure 5A:
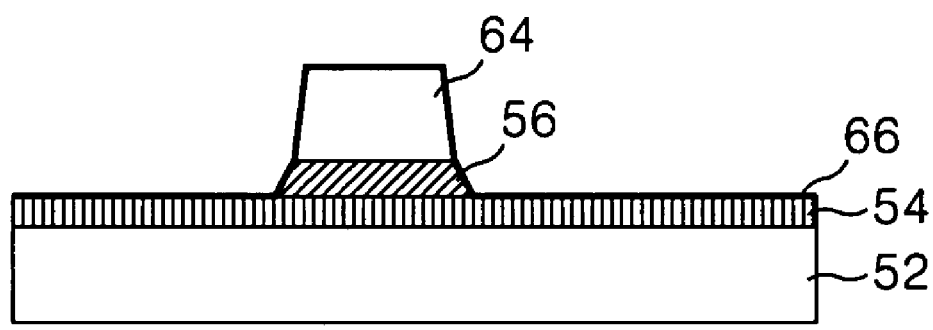
FIG. 5A to FIG. 5C are section views illustrating a method of patterning a transparent conductive film according to another embodiment of the present invention step by step.

Referring to FIG. 5A, the organic film 56 is formed on a specific area of the inorganic film 54 provided on the substrate 52. The organic film 56 is provided by entirely depositing an organic substance and then patterning it by an etching process using a photo-resist pattern 64 formed by the photolithography as a mask. Further, a crystallization catalyst layer 66 is entirely formed in such a state that the photo-resist pattern 64 has been left on the organic film 56. The crystallization catalyst layer 66 is formed from a refractory metal such as Ni, Cu, In, Sn, Mo, Tn, W, Cr or Hf, etc. Metal atoms of such a crystallization catalyst layer 66 are formed on a sparsely basis to make a nucleus production cite for accelerating a crystallization of the transparent conductive film to be formed thereon.

Figure 5B:
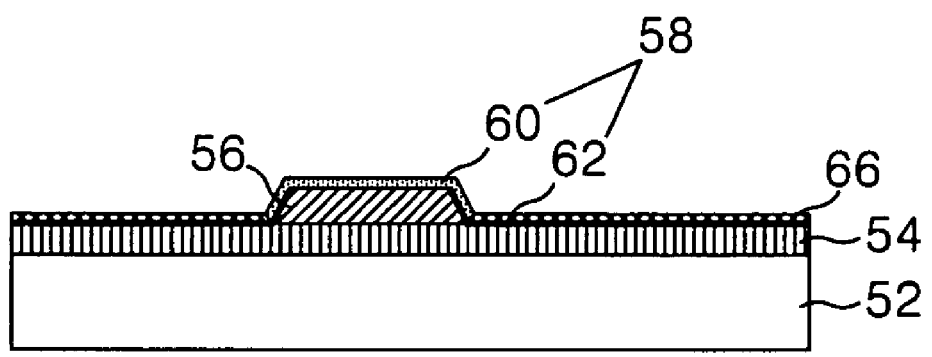

Next, the photo-resist pattern 64 is removed by a stripping process or the lift-off process as shown in FIG. 5B. In this case, the crystallization catalyst layer 66 formed thereon also is removed along with the photo-resist pattern 64. As a result, the crystallization catalyst layer 66 is left only on the inorganic film 54.

Figure 5C:
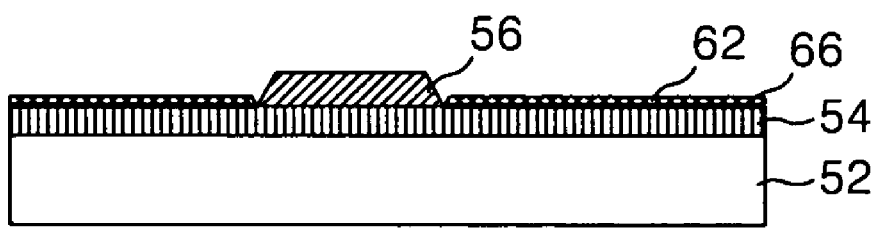

Subsequently, a transparent conductive film 58 is deposited onto the organic film 56 and the inorganic film 54 on which the crystallization catalyst layer 66 has been formed as shown in FIG. 5C. In this case, the transparent conductive film 58 is deposited while heating the substrate 52 at a temperature of about 100° C. or more, to thereby divide the transparent conductive film 58 into the amorphous transparent conductive film 60 formed on the inorganic film 56 and the crystalline transparent conductive film 62 formed on the inorganic film 54. Herein, as the crystallization catalyst layer 66 has been formed on the inorganic film 54, a crystallization rate of the crystalline transparent conductive film becomes faster. Accordingly, it becomes possible to enhance a crystallization degree of the crystalline transparent conductive film 62 formed on the inorganic film 54. Furthermore, if the crystallization catalyst layer is employed, then it becomes possible to lower a heating temperature of the substrate 52 for a crystallization of the transparent conductive film 58 from about 180° C. until about 100° C.

Further, the transparent conductive film 58 is selectively etched by an etchant for amorphous substance based on an oxalic acid (C2H2O4), to thereby left only a crystalline transparent conductive film 62 as shown in FIG. 5C. In this case, the crystalline transparent conductive film 62 on the inorganic film 54 in which a crystallization degree is enhanced by the crystallization catalyst layer 66 has a larger etching ratio difference from the amorphous transparent conductive film 60 on the inorganic film 56. Accordingly, a stable removal of only the amorphous transparent film 60 can be made without a damage of the crystalline transparent conductive film 62.

As described above, the method of patterning the transparent conductive film according to the embodiment of the present invention allows the transparent conductive film to be grown into an amorphous substance on the organic film while being grown into a crystalline substance on the inorganic film, thereby selectively etching out the amorphous transparent conductive film on the organic film with the aid of an amorphous etchant. Also, the method of patterning the transparent conductive film according to the embodiment of the present invention adopts the crystallization catalyst layer to more enhance a crystallization degree of the crystalline transparent conductive film, thereby assuring a stability of the transparent conductive film patterning process. Accordingly, the method of patterning the transparent conductive film according to the embodiment of the present invention can pattern the transparent conductive film without the photolithography process using the mask, thereby simplifying the manufacturing process.

Moreover, if the method of patterning the transparent conductive film according to the embodiment of the present invention is used, then it becomes possible to reduce the photolithography process making use of a single of mask from the manufacturing process of the display device employing the patterned transparent conductive film. For example, if the above-mentioned selective etching method of the transparent conductive film is used for the manufacturing process of the thin film transistor substrate of the liquid crystal display requiring at least four mask processes, then a mask process for patterning the transparent conductive film can be eliminated, thereby reducing the number of manufacturing processes into three mask processes.

Figure 6:
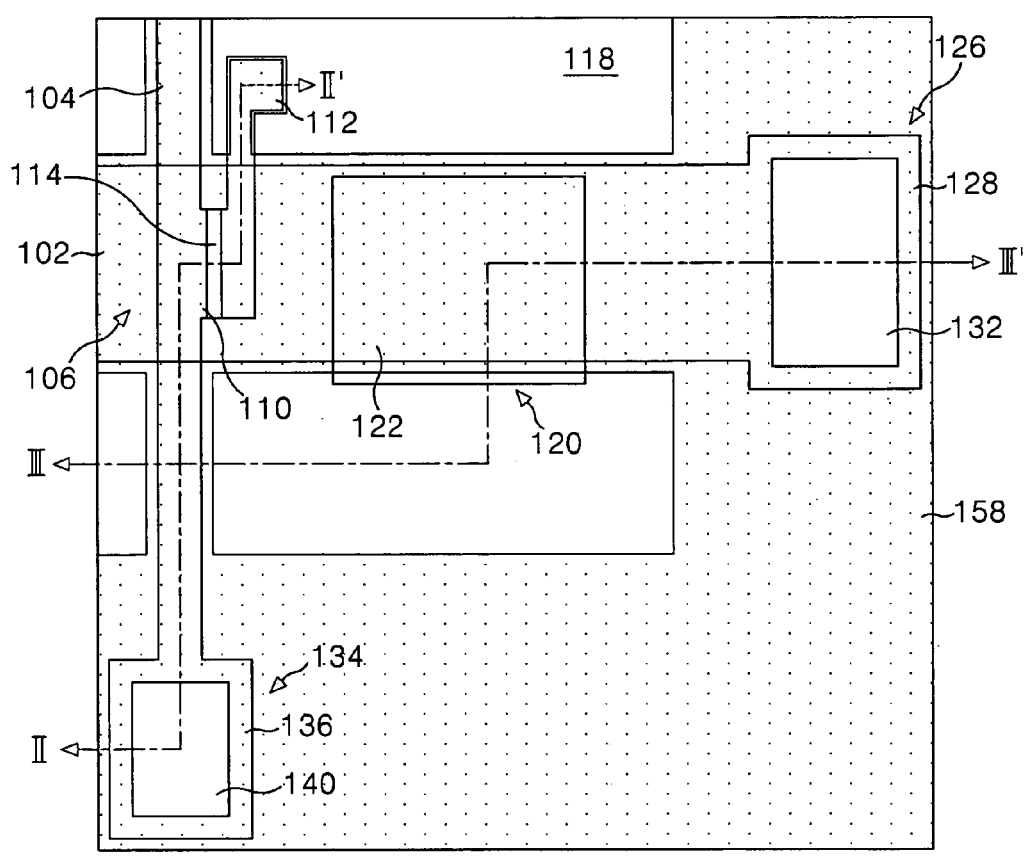
FIG. 6 is a plan view showing a portion of a thin film transistor substrate according to an embodiment of the present invention.
Figure 7:
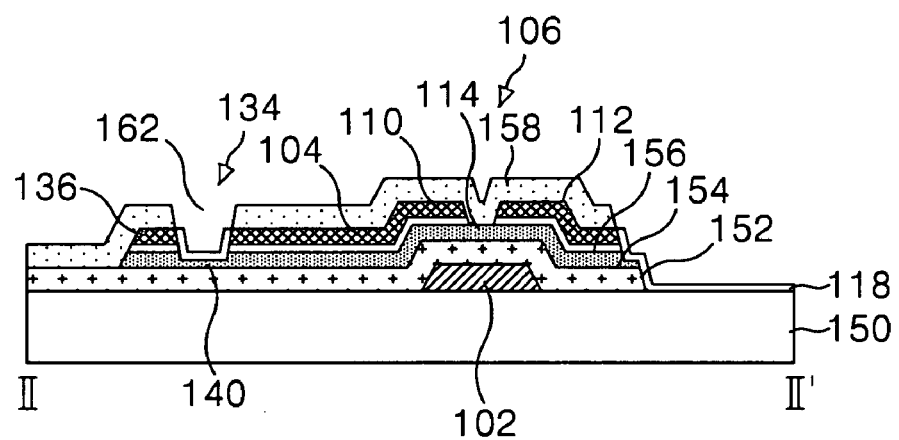
FIG. 7 is a section view of the thin film transistor substrate taken along the II-II' line and the III-III' line in FIG. 6.
Figure 7:
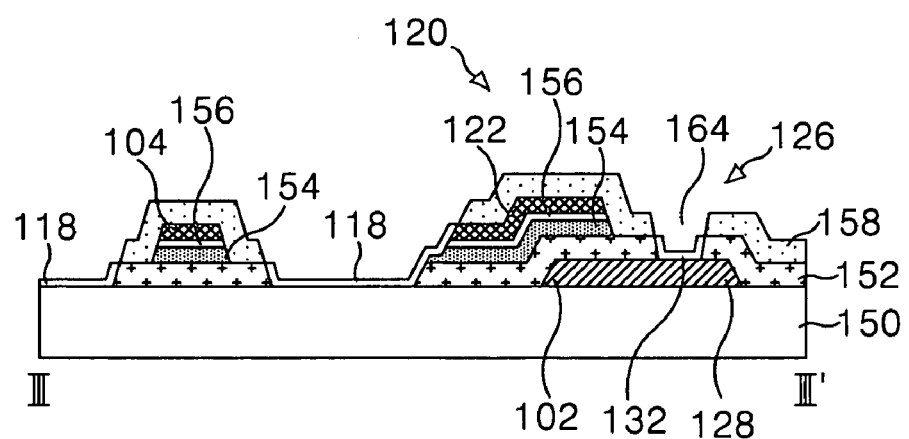

FIG. 6 is a plan view of a thin film transistor substrate according to the embodiment of the present invention to which the above-mentioned patterning method of the transparent conductive film, and FIG. 7 is a section view of the thin film transistor substrate taken along the II-II' line and the III-III' line in FIG. 6.

The thin film transistor substrate shown in FIG. 6 and FIG. 7 includes a gate line 102 and a data line 104 provided on a lower substrate 150 in such a manner to intersect each other with having a gate insulating film 44 therebetween, a thin film transistor 106 provided at each intersection, and a pixel electrode 118 provided at a cell area having a crossing structure. Further, the thin film transistor substrate includes a storage capacitor 120 provided at an overlapped portion between a storage upper electrode 122 connected to the pixel electrode 118 and the pre-stage gate line 102, a gate pad portion 126 connected to the gate line 102, and a data pad portion 134 connected to the data line 104.

The thin film transistor 106 allows a pixel signal applied to the data line 104 to be charged into the pixel electrode 118 and be kept in response to a scanning signal applied to the gate line 102. To this end, the thin film transistor 106 includes a gate electrode included in the gate line 102, a source electrode 110 connected to the data line 104, a drain electrode 112 positioned in opposition to the source electrode 110 and connected to the pixel electrode 16, and an active layer 154 formed on a gate insulating film 152 overlapping with the gate line 102 in such a manner to overlap with the source electrode 110 and the drain electrode 112 to thereby define a channel 114.

The active layer 154 also overlaps with the data pad lower electrode 136, the storage upper electrode 122 and the data line 104. On the active layer 154, an ohmic contact layer 156 for make an ohmic contact with the data pad lower electrode 136, the storage upper electrode 122, the data line 104, the source electrode 110 and the drain electrode 112 is further provided.

The pixel electrode 118 is connected to the drain electrode 112 of the thin film transistor 106. More specifically, the pixel electrode 118 makes a side contact with a protrusion of the drain electrode 112. In this case, so as to enlarge a side contact area between the pixel electrode 118 and the drain electrode 112, the protrusion of the drain electrode 112 has a shape bent at least once. The pixel electrode 118 generates a potential difference with respect to a common electrode provided at a color filter substrate (not shown) by the charged pixel signal. This potential difference rotates liquid crystal positioned at the thin film transistor substrate and the color filter substrate owing to a dielectric anisotropy and transmits a light inputted, via the pixel electrode 118, from a light source (not shown) toward the color filter substrate.

The storage capacitor 120 consists of a pre-stage gate line 102, and a storage upper electrode 122 overlapping with the gate line 102 with having the gate insulating film 152, the active layer 154 and the ohmic contact layer 156 therebetween and connected to the pixel electrode 118. Herein, the pixel electrode 118 makes a side contact with the storage upper electrode 122. The storage capacitor 120 having the structure as mentioned above allows a pixel signal charged in the pixel electrode 118 to be maintained stably until the next pixel signal is charged.

The gate line 102 is connected, via the gate pad portion 126, to a gate driver (not shown). The gate pad portion 126 consists of a gate pad lower electrode 128 extended from the gate line 102, and a gate pad upper electrode 132 connected above the gate pad lower electrode 128. Herein, the gate pad upper electrode 132 is formed within a first contact hole 164 passing through an organic protective film 158 and the gate insulating film 152.

The data line 104 is connected, via the data pad portion 134, to the data driver (not shown). The data pad portion 134 consists of a data pad lower electrode 136 extended from the data line 104, and a data pad upper electrode 140 connected to the data pad lower electrode 136. The data pad portion 134 further includes the gate insulating film 152, the active layer 154 and the ohmic contact layer 156 that are provided between the data pad lower electrode 136 and the lower substrate 150. In such a data pad portion 134, the data pad upper electrode 140 is formed within a second contact hole passing through the organic protective film 158 and the data pad lower electrode 136 to thereby make a side contact with the data pad lower electrode 136.

The pixel electrode 118, the gate pad upper electrode 132 and the data pad upper electrode 140 are made from a transparent conductive material, whereas the organic protective film 158 is made from an organic material. As such a thin film transistor substrate makes use of the above-mentioned selective etching method of the transparent conductive film, the transparent conductive film patterns including the pixel electrode 118, the gate pad upper electrode 132 and the data pad upper electrode 140 makes an interface with the organic protective film 158 without any overlaps.

Figure 8A:
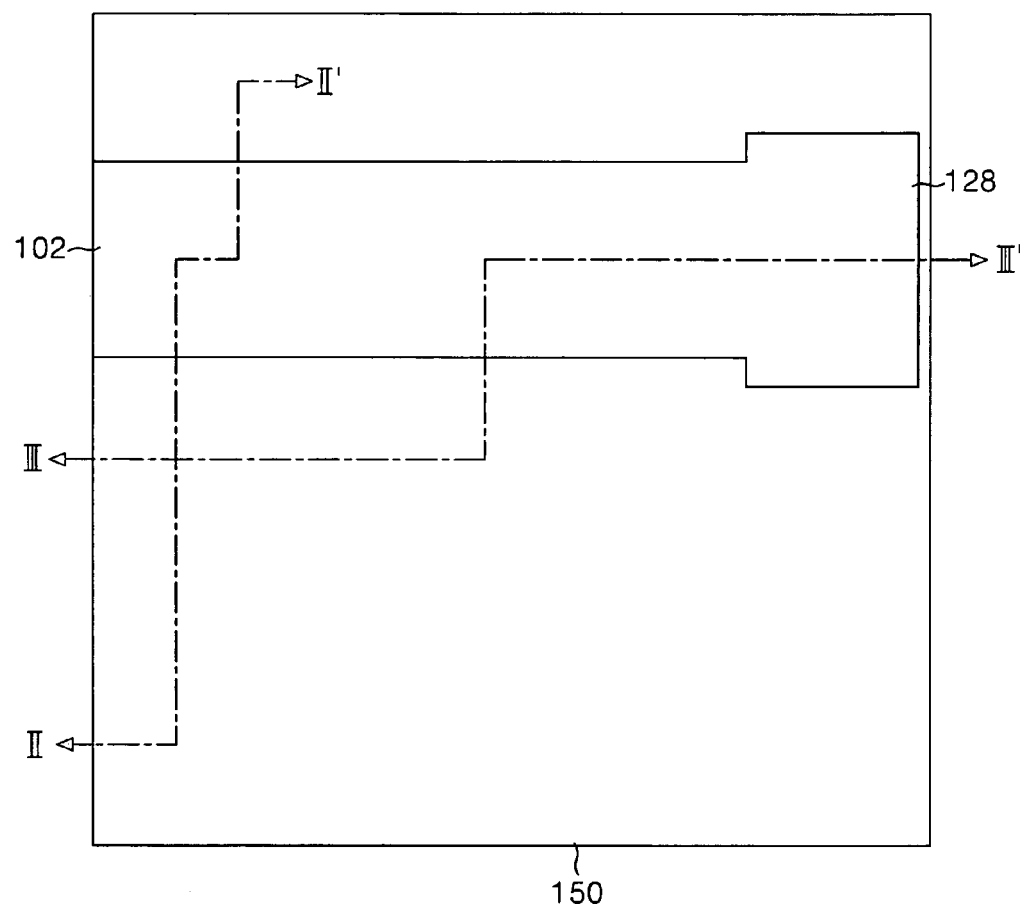
FIG. 8A and FIG. 8B are a plan view and a section view for explaining a first mask process, respectively, in the method of manufacturing the thin film transistor substrate according to the embodiment of the present invention.
Figure 8B:
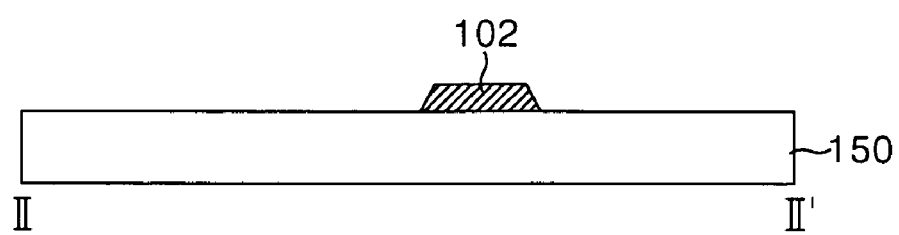
Figure 8B:
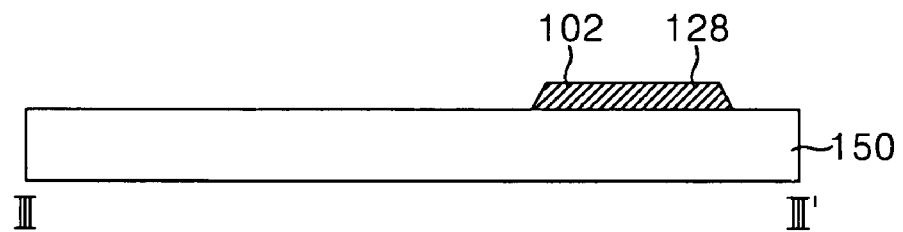

FIG. 8A and FIG. 8B shows a plan view and a section view for explaining a first mask process, respectively, in a method of fabricating a thin film transistor substrate according to an embodiment of the present invention.

Gate metal patterns including the gate line 102 and the gate pad lower electrode 128 are provided on the lower substrate 150 using the first mask process.

More specifically, a gate metal layer is formed on the lower substrate 150 by a deposition technique such as a sputtering. Then, the gate metal layer is patterned by the photolithography and the etching process employing a first mask to thereby form the gate metal patterns including the gate line 102 and the gate pad lower electrode 128. Herein, the gate metal is made from Cr, MoW, Cr/Al, Cu, Al(Nd), Mo/Al, Mo/Al(Nd) or Cr/Al(Nd), etc.

Figure 9A:
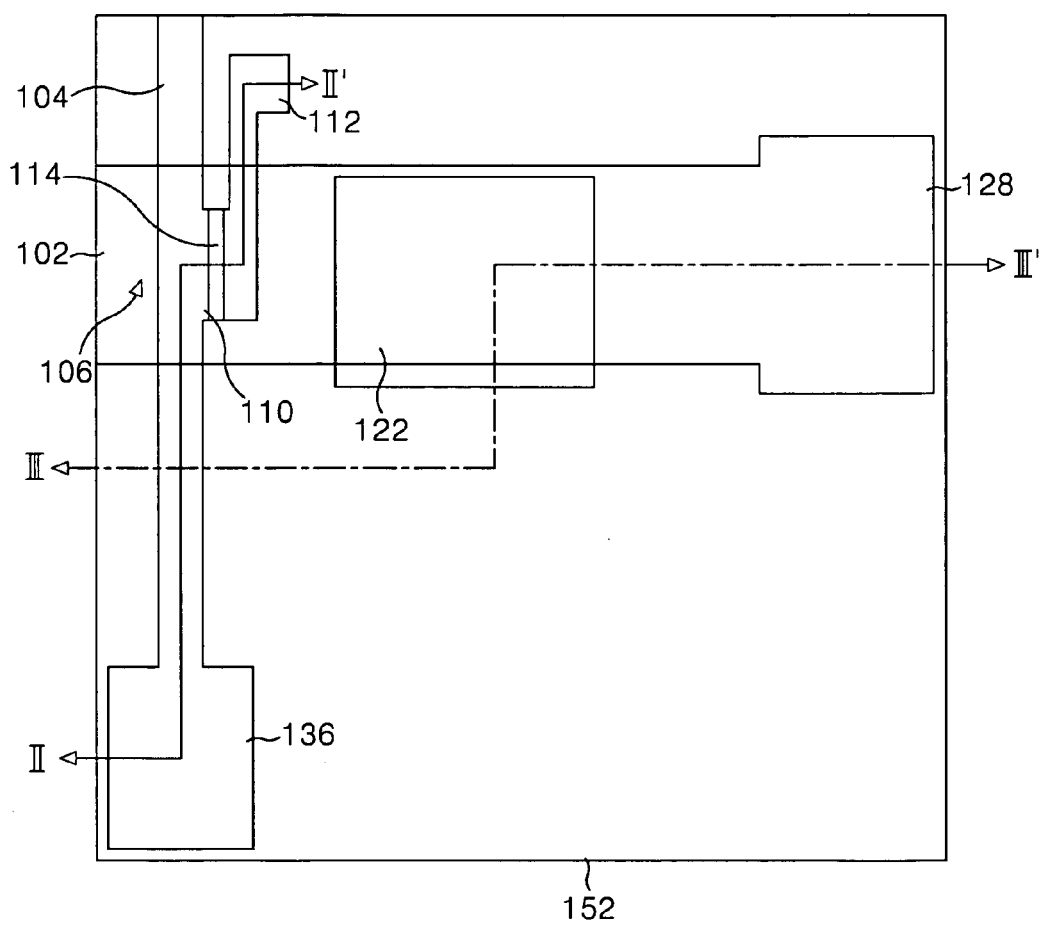
FIG. 9A to FIG. 9D are plan views and section views for explaining a second mask process, respectively, in the method of manufacturing the thin film transistor substrate according to the embodiment of the present invention.
Figure 9B:
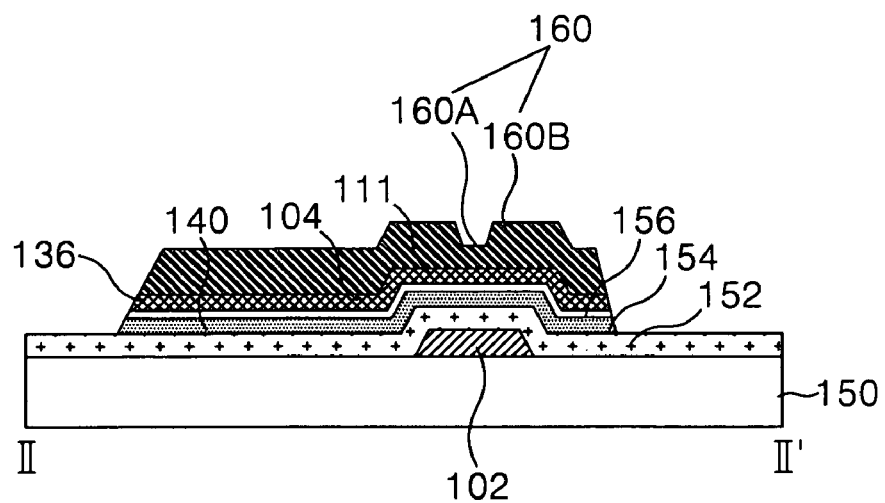
Figure 9B:
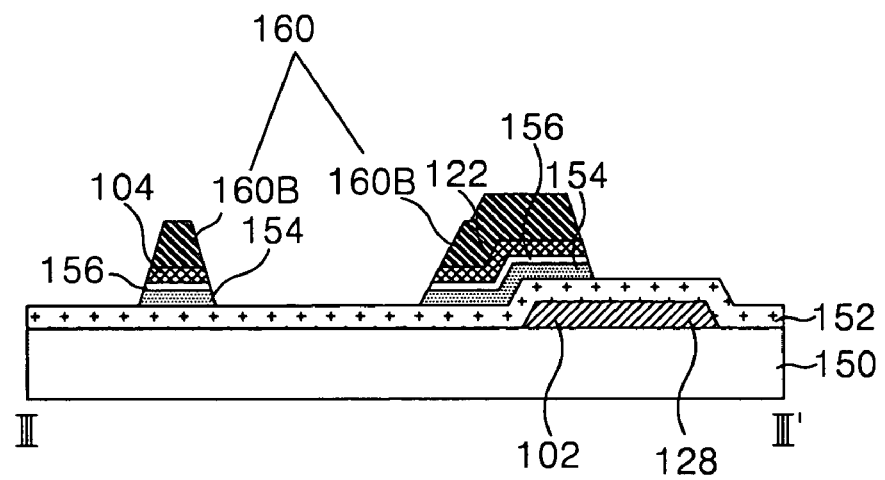
Figure 9C:
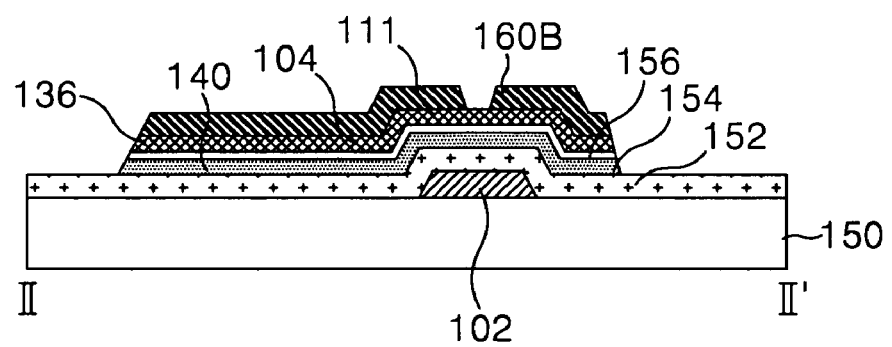
Figure 9C:
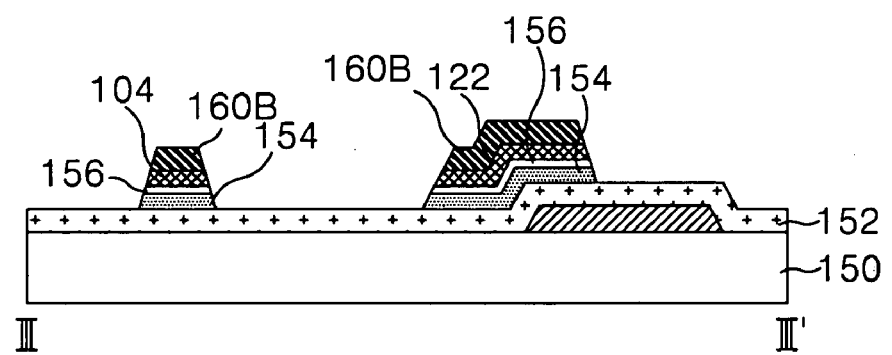
Figure 9D:
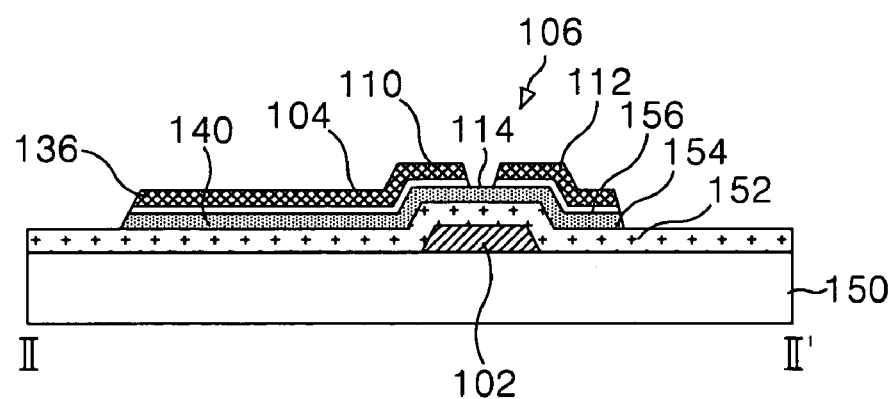
Figure 9D:
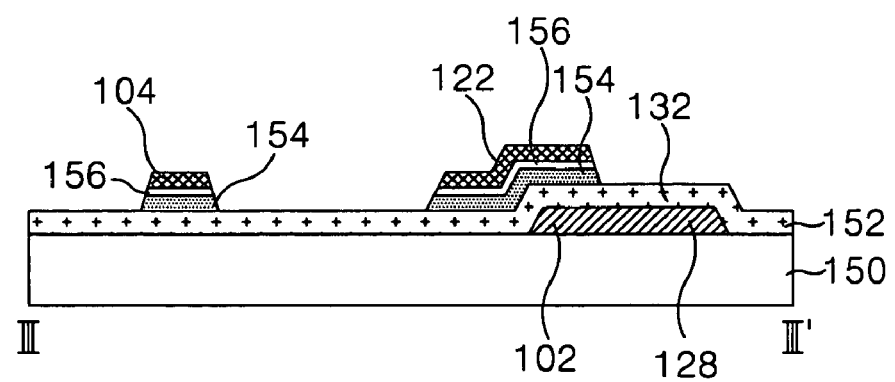

FIG. 9A and FIG. 9B shows a plan view and a section view for explaining a second mask process, respectively, in the method of fabricating the thin film transistor substrate according to the embodiment of the present invention. Herein, FIG. 9B to FIG. 9D illustrate the second mask process step by step.

Firstly, the gate insulating film 152 is entirely formed on the lower substrate 150 at which the gate metal pattern are formed by deposition techniques such as the PECVD and the sputtering, etc. The gate insulating film 152 is made from an inorganic insulating material such as silicon nitride (SiNx) or silicon oxide (SiOx).

Next, semiconductor patterns including the active layer 154 and the ohmic contact layer 156 disposed on the gate insulating film 152 and source/drain metal patterns including the data line 104, the source electrode 110, the drain electrode 112, the data pad lower electrode 136 and the storage electrode 122 are sequentially formed on the gate insulating film 152 using the second mask process.

More specifically, an amorphous silicon layer, a n+ amorphous silicon layer and a source/drain metal layer are sequentially provided on the gate insulating film 152 by deposition techniques such as the plasma enhanced chemical vapor deposition (PECVD) and the sputtering, etc. Herein, the source/drain metal is made from Cr, MoW, Cr/Al, Cu, Al(Nd), Mo/Al, Mo/Al(Nd) or Cr/Al(Nd), etc.

Then, a photo-resist pattern is entirely coated onto the source/drain metal layer and thereafter a photo-resist pattern 160 having a step coverage as shown in FIG. 9B is provided by the photolithography using a second mask that is a partial exposure mask. In this case, a partial exposure mask having a diffractive exposing part (or semi-transmitting part) at a position where the channel 114 of the thin film transistor is to be formed is used as the second mask. Thus, a photo-resist pattern 160A corresponding to the diffractive exposing part (or semi-transmitting part) of the second mask has a lower height than a photo-resist pattern 160B corresponding to the transmitting part (or shielding part) of the second mask. In other words, the photo-resist pattern 160A at the channel portion has a lower height than the photo-resist pattern 160B at other source/drain metal pattern portion.

Subsequently, the source/drain metal layer is patterned by a wet etching process using the photo-resist pattern 160 to thereby provide the source/drain metal patterns including the data line 104, a source/drain metal pattern 111 at the thin film transistor portion and the storage upper electrode 122 as shown in FIG. 9B.

Further, the n+ amorphous silicon layer and the amorphous silicon layer are patterned at the same time by a dry etching process using the same photo-resist pattern 160 to thereby provide the ohmic contact layer 154 and the active layer 156 that have a structure formed in conformity to the source/drain metal pattern.

Next, the photo-resist pattern 160A at a channel portion having a relatively low height is removed by the ashing process using an oxygen (O2) plasma as shown in FIG. 9C, whereas the photo-resist pattern 160B at other source/drain metal pattern portion has a lowered height.

The source/drain metal pattern 111 and the ohmic contact layer 156 at a portion where the channel 114 is to be formed are etched by a dry etching process using the remaining photo-resist pattern 160B as shown in FIG. 9D, thereby disconnecting the source electrode 110 from the drain electrode 112 and exposing the active layer 154. Thus, the channel 114 formed from the active layer 154 is provided between the source electrode 110 and the drain electrode 112.

Further, the photo-resist pattern 160B left at the source/drain pattern portion is entirely removed by the stripping process.

Figure 10A:
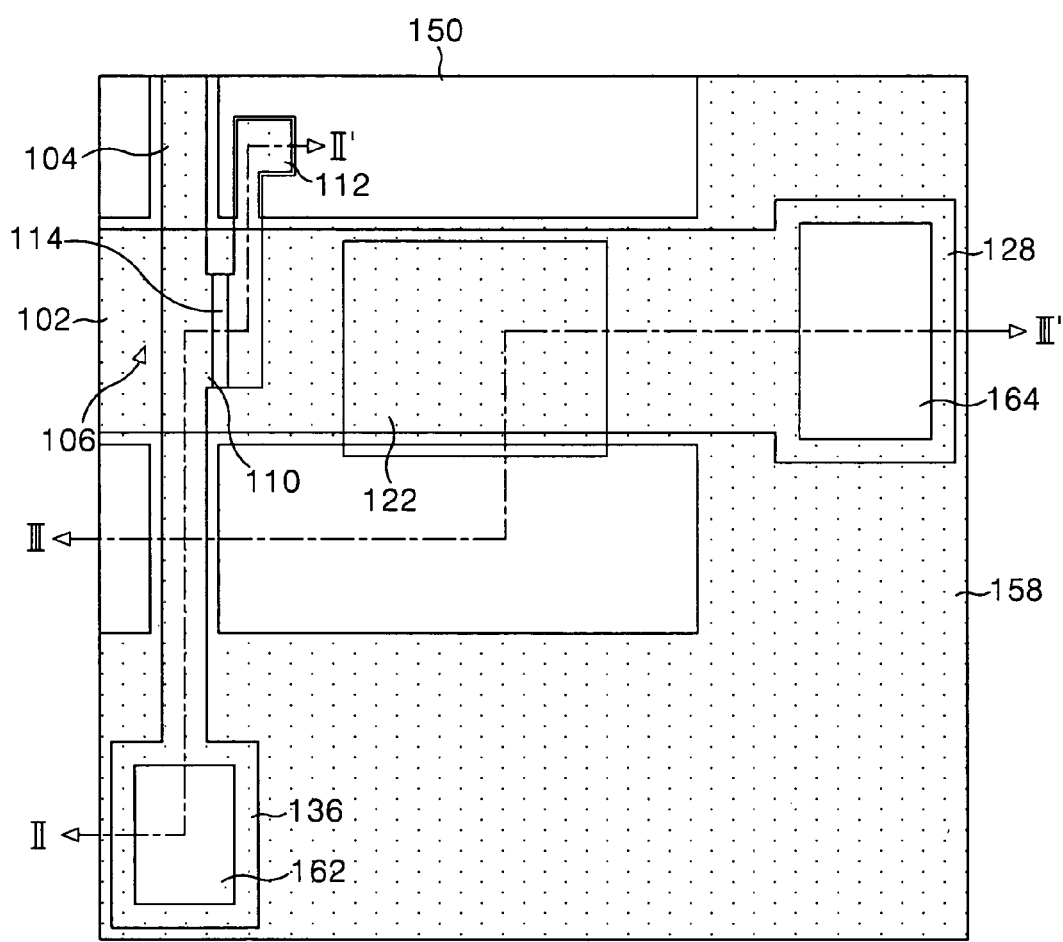
FIG. 10A and FIG. 10B are a plan view and a section view for explaining a third mask process, respectively, in the method of manufacturing the thin film transistor substrate according to the embodiment of the present invention.
Figure 10B:
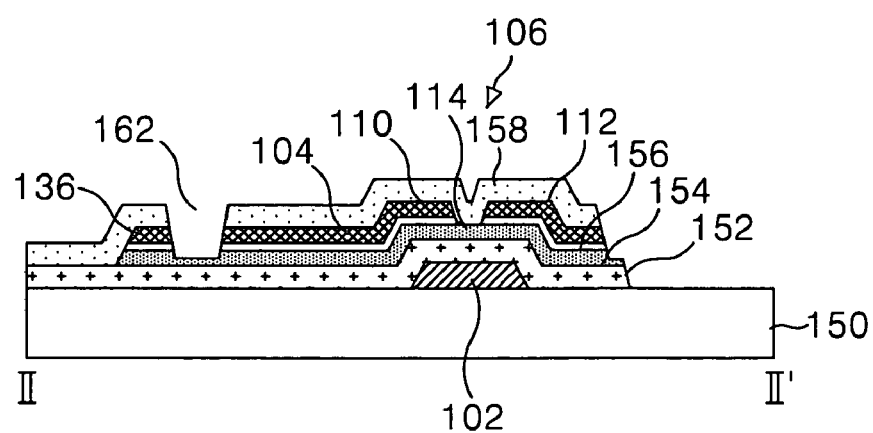
Figure 10B:
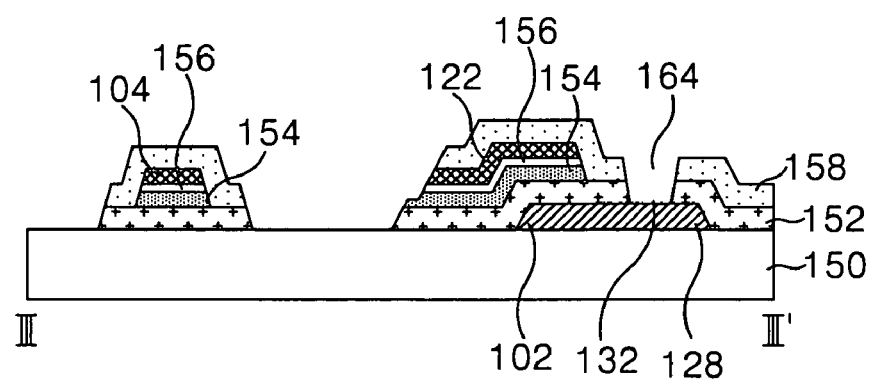

FIG. 10A and FIG. 10B shows a plan view and a section view for explaining a third mask process, respectively, in the method of fabricating the thin film transistor substrate according to the embodiment of the present invention.

The organic protective film are formed at the uppermost layer of the thin film transistor substrate and the gate insulating film 152 is patterned along with the organic protective film 158 by the third mask process.

More specifically, the organic protective film 158 is entirely coated onto the gate insulating film 152 on which the semiconductor pattern and the source/drain metal pattern are disposed. The organic protective film 158 is formed from an organic insulating material having a small dielectric constant such as an acrylic organic compound, BCB (benzocyclobutene) or PFCB (perfluorocyclobutane), etc.

Subsequently, the organic protective film 158 and the gate insulating film 152 positioned beneath it are patterned by the photolithography and the etching process using the third mask. Thus, in the following process, the organic protective film 158 and the gate insulating film 152 at a pixel area where the pixel electrode 118 is to be formed are removed to thereby have an exposed structure of the substrate 150. Further, the gate pad portion is provided with the first contact hole 164 passing through the organic protective film 158 and the gate insulating film 152 to thereby have an exposed structure of the gate pad lower electrode 128. The data pad portion has a structure in which the second contact hole 162 passing through the organic protective film 158 is defined. Herein, if the data pad lower electrode 140 is made from molybdenum (Mo), then the organic protective film 158 is etched out when the second contact hole 162 is formed, thereby allowing the second contact hole 162 to pass through the organic protective film 158 and the data pad lower electrode 136 and thus exposing the side surface of the data pad lower electrode 136. Moreover, the second contact hole 162 further passes through the ohmic contact layer beneath the data pad lower electrode 136 to thereby make a partial etching until the active layer 154 and expose the partially etched active layer 154. In this case, as an etching ratio of the data pad lower electrode 136 is lower than that of the gate insulating film 152, the gate insulating film 152 at the data pad portion is not etched.

Figure 11A:
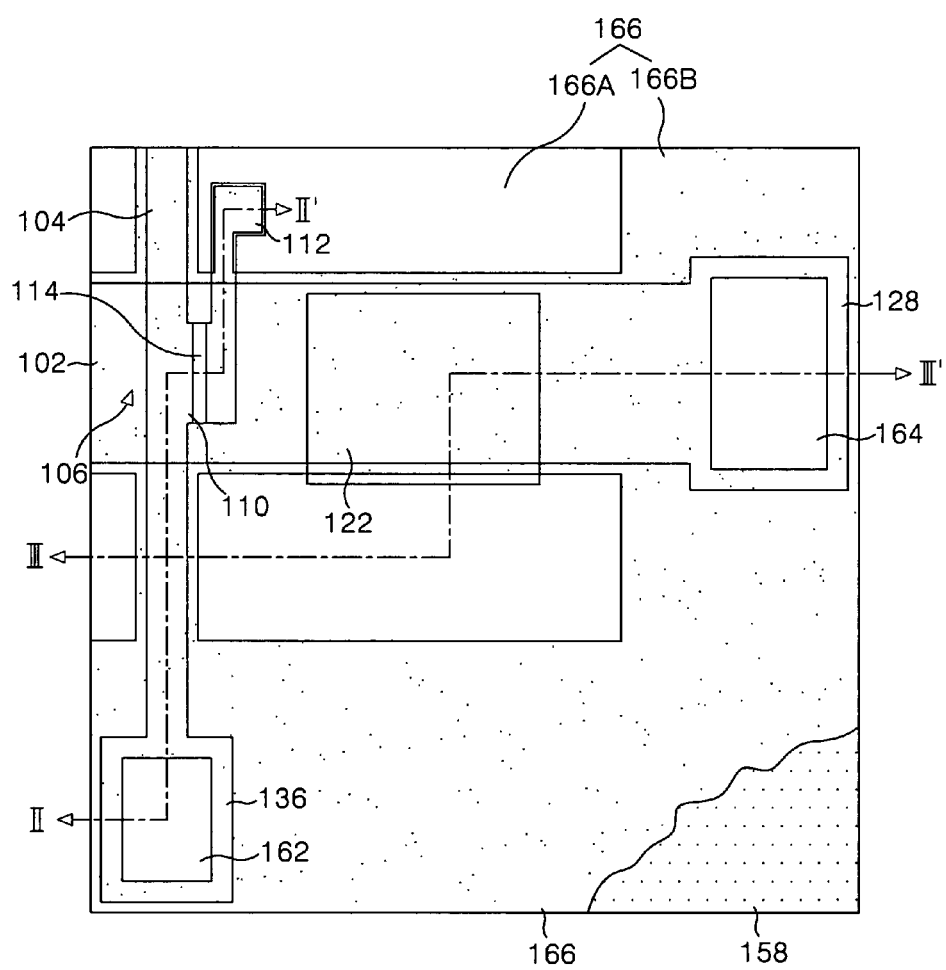
FIG. 11A and FIG. 11B are a plan view and a section view for explaining a transparent conductive film deposition process, respectively, in the method of manufacturing the thin film transistor substrate according to the embodiment of the present invention.
Figure 11B:
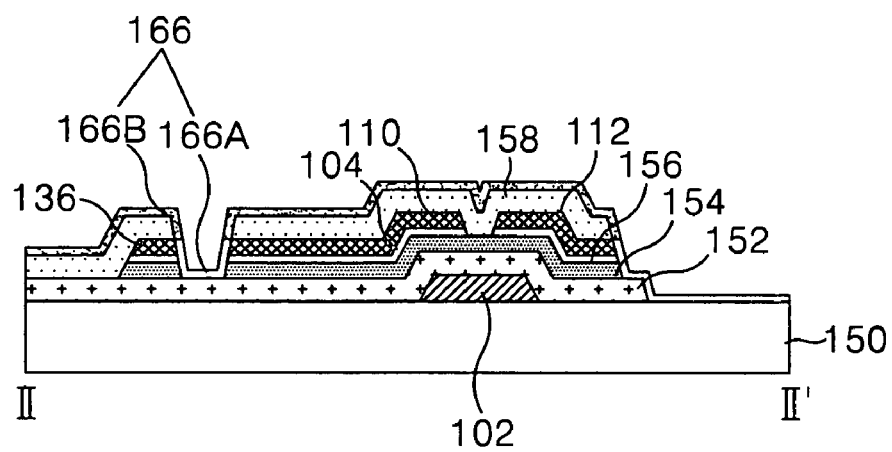
Figure 11B:
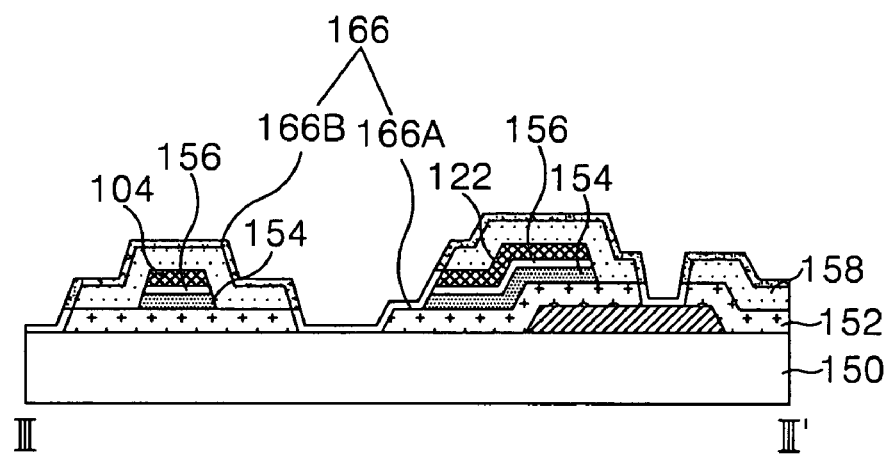

FIG. 11A and FIG. 11B are a plan view and a section view for explaining a deposition process of a transparent conductive film 166, respectively, in the method of manufacturing the thin film transistor substrate according to the embodiment of the present invention.

The transparent conductive film 166 divided into an amorphous transparent conductive film 166B and a crystalline transparent conductive film 166A are provided at a different crystallization ratio depending upon a growth condition.

More specifically, the transparent conductive film 166 is formed on the thin film transistor substrate having the organic protective film 158 at the uppermost layer thereof by a deposition technique such as the sputtering, etc. In this case, the thin film transistor substrate is heated at a substrate temperature of about 100° C. to 200° C., thereby forming the transparent conductive film 166B above the organic protective film 158 into an amorphous substance while forming the transparent conductive film 166A above the inorganic material including the substrate 150, the gate insulating film 152, the source/drain metal pattern and the semiconductor pattern into a crystalline material. As a result, the crystalline transparent conductive film 166A is provided at a pixel area where the pixel electrode is to be formed and an inorganic material area including the first contact hole 164 of the gate pad portion and the second contact hole 162 of the data pad portion, whereas the amorphous transparent conductive film 166B is provided at the upper portion of the organic protective film 156 that is the remaining area. Further, so as to prevent the transparent conductive film 166B on the organic protective film 158 from being grown from an amorphous substance into a crystalline substance, the transparent conductive film 166 is formed at a thickness of about 500 Å (angstroms) or less.

Herein, the transparent conductive film 166 is formed from indium-tin-oxide (ITO), tin-oxide (TO), indium-zinc-oxide (IZO) or SnO2.

Figure 12A:
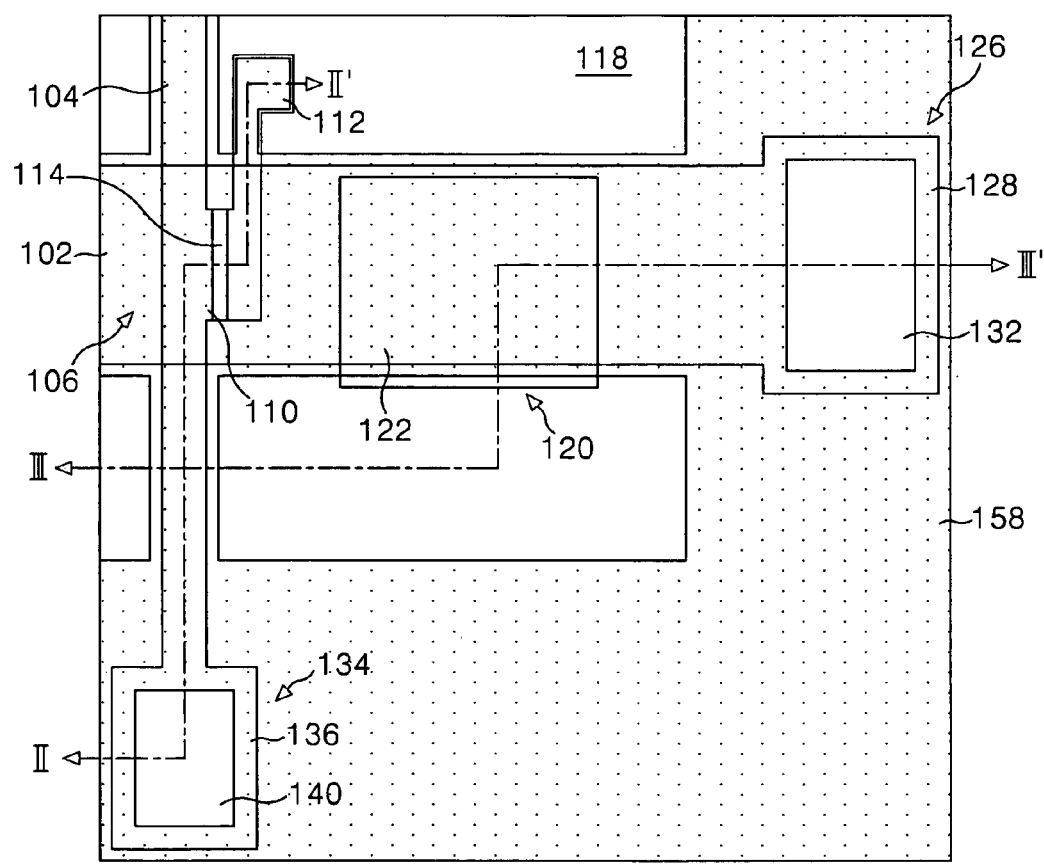
FIG. 12A and FIG. 12B are a plan view and a section view for explaining a selective etching process for the transparent conductive film, respectively, in the method of manufacturing the thin film transistor substrate according to the embodiment of the present invention.
Figure 12B:
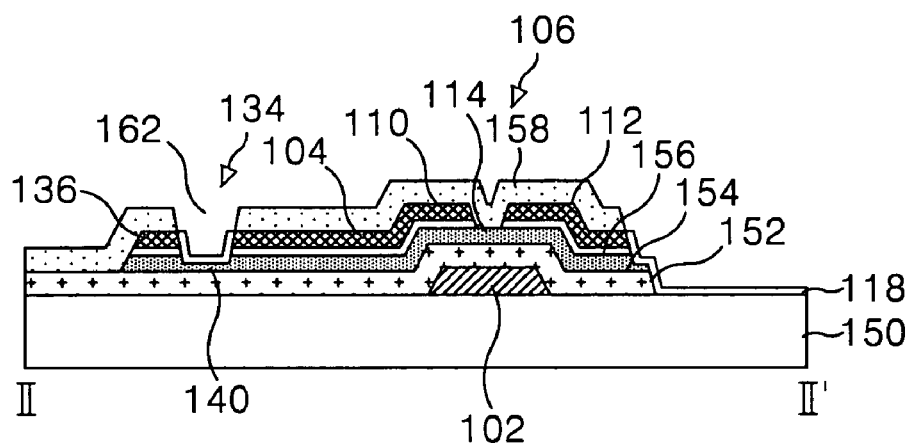
Figure 12B:
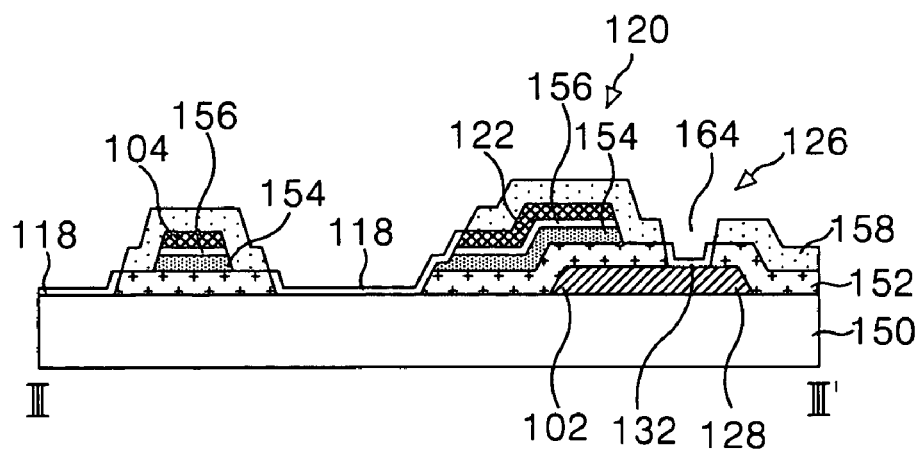

FIG. 12A and FIG. 12B are a plan view and a section view for explaining a selective etching process of the transparent conductive film 166, respectively, in the method of manufacturing the thin film transistor substrate according to the embodiment of the present invention.

A transparent conductive film pattern including the pixel electrode 118, the gate pad upper electrode 132 and the data pad upper electrode 140 are provided by the selective etching process of the transparent conductive film 166.

More specifically, only the amorphous transparent conductive film 166B, of the transparent conductive film 166 divided into the crystalline transparent conductive film 166A and the amorphous transparent conductive film 166B, is selectively etched out with the aid of an etchant for amorphous substance. For example, the amorphous transparent conductive film 166B on the organic protective film 158 is selectively etched out by a wet etching process using an etchant for amorphous substance based on a thin oxalic acid ($C_2H_2O_4$) having a 10 weight % or less, preferably a 3 to 5 weight % oxalic acid, while the crystalline transparent conductive film 166A is left.

Accordingly, the pixel electrode 118, the gate pad upper electrode 132 and the data pad upper electrode 140 formed from the crystalline transparent conductive film 166A are provided. The pixel electrode 118 is provided at a pixel area to make a side contact with the drain electrode 112 and the storage upper electrode 122. The gate pad upper electrode 132 is provided within the first contact hole 162 of the gate pad portion 126 to make a surface contact with the gate pad lower electrode 128. The data pad upper electrode 140 is provided within the second contact hole 164 of the data pad portion 134 to make a side contact with the data pad lower electrode 136.

Such a crystalline transparent conductive film 166B including the pixel electrode 118, the gate pad upper electrode 132 and the data pad upper electrode 140, that is, the transparent conductive film pattern makes an interface with the organic protective film 158 without any overlaps as shown in FIG. 12B.

FIG. 13A to FIG. 13D explain a method of manufacturing a thin film transistor substrate according to a second embodiment of the present invention. Particularly, they are section views for explaining a third mask process and a selective etching process of the transparent conductive film in the manufacturing method.

The method of manufacturing the thin film transistor substrate according to the second embodiment of the present invention further includes a step of forming a crystallization catalyst layer 182 for accelerating a crystalline rate of the transparent conductive film in comparison to the method of manufacturing the thin film transistor substrate according to the first embodiment of the present invention. Herein, the first and second mask processes are identical to the above-mentioned processes.

Figure 13A:
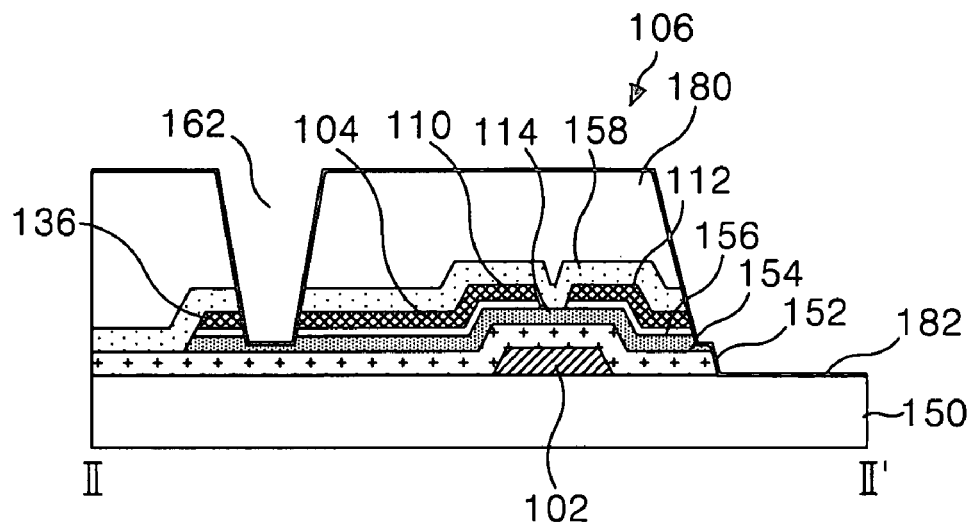
FIG. 13A to FIG. 13D are section views for explaining a third mask process and a selective etching process for a transparent conductive film in a method of manufacturing a thin film transistor substrate according to a second embodiment of the present invention.
Figure 13A:
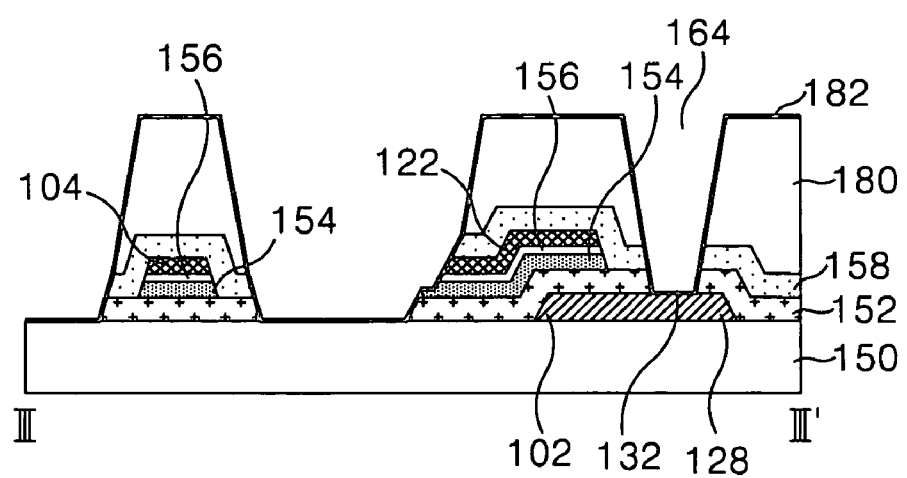

Referring to FIG. 13A, the organic protective film 158 are formed at the uppermost layer of the thin film transistor substrate and the gate insulating film 152 is patterned along with the organic protective film 158 by the third mask process.

More specifically, the organic protective film 158 is entirely coated onto the gate insulating film 152 on which the semiconductor pattern and the source/drain metal pattern are disposed. Subsequently, the organic protective film 158 and the gate insulating film 152 positioned beneath it are patterned by the etching process employing a photo-resist pattern 180 formed by the photolithography using the third mask. Thus, in the following process, the organic protective film 158 and the gate insulating film 152 at a pixel area where the pixel electrode 118 is to be formed are removed to thereby have an exposed structure of the substrate 150. Further, the gate pad portion is provided with the first contact hole 164 passing through the organic protective film 158 and the gate insulating film 152 to thereby have an exposed structure of the gate pad lower electrode 128. The data pad portion is provided with the second contact hole 162 passing through the organic protective film 158 to thereby have an exposed structure of the side surface of the data pad lower electrode 136.

Next, a crystallization catalyst layer 182 is entirely formed on the thin film transistor substrate at which the photo-resist pattern 180 has been left. The crystallization catalyst layer 182 is formed from a refractory metal such as Ni, Cu, In, Sn, Mo, Tn, W, Cr or Hf, etc. Metal atoms of such a crystallization catalyst layer 182 are formed on a sparsely basis to make a nucleus production cite for accelerating a crystallization of the transparent conductive film to be formed thereon.

Figure 13B:
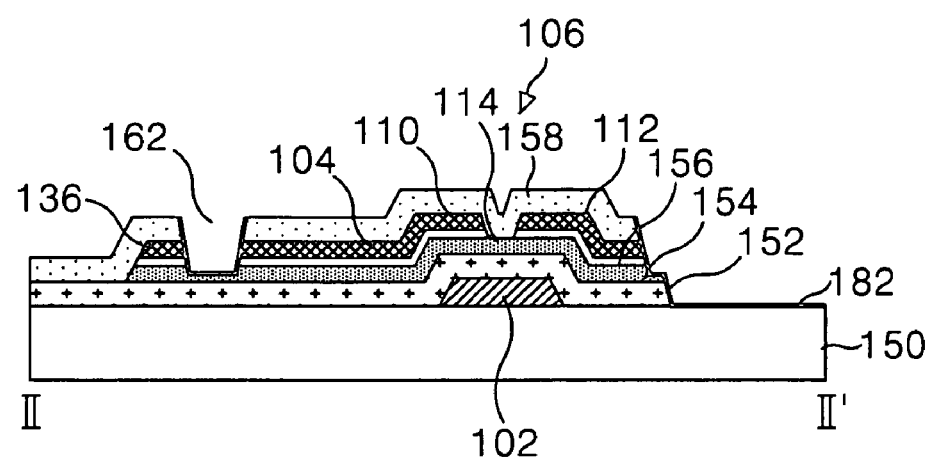
Figure 13B:
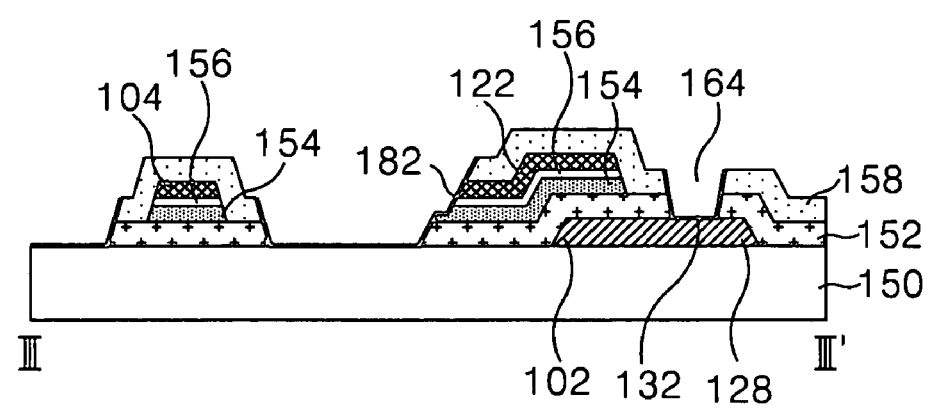

Referring to FIG. 13B, the photo-resist pattern 180 is removed along with the crystallization catalyst layer 182 formed thereon by the stripping process or the lift-off process. Thus, the crystallization catalyst layer 182 is left only at the remaining area excluding the organic protective film 158 from the thin film transistor substrate, that is, the inorganic material area.

Figure 13C:
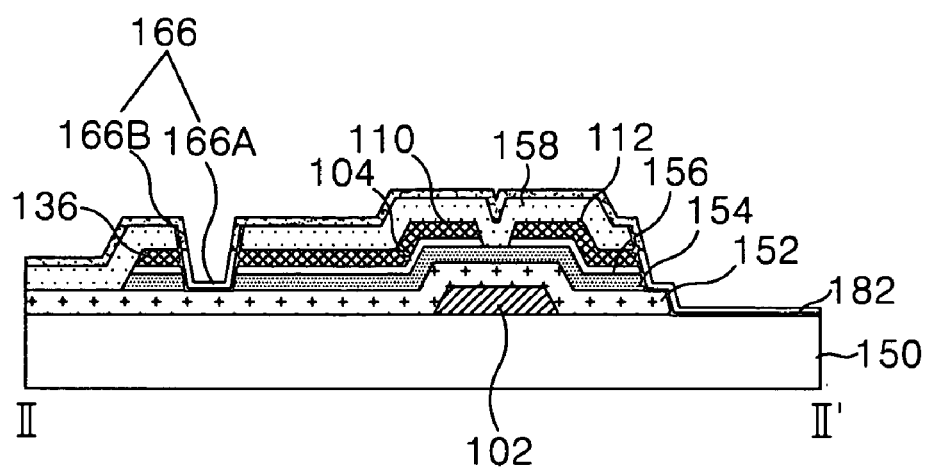
Figure 13C:
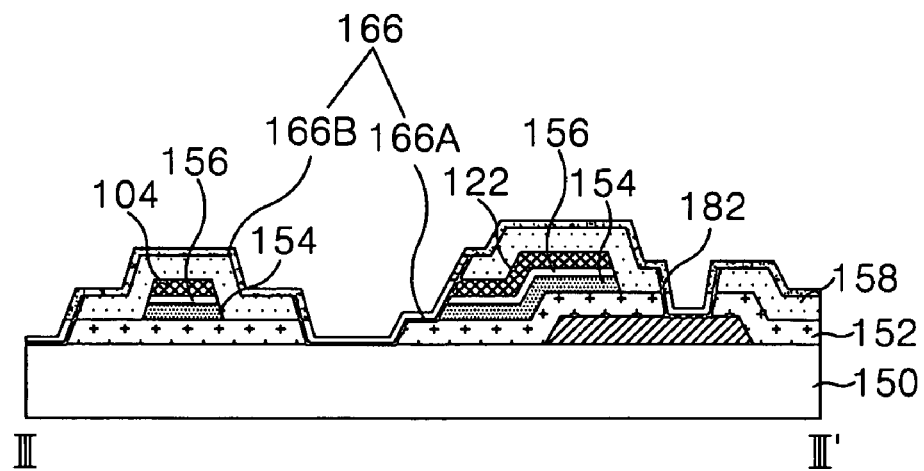

Referring to FIG. 13C, the transparent conductive film 166 divided into an amorphous transparent conductive film 166B and a crystalline transparent conductive film 166A are provided on the organic protective film 158 and the crystallization catalyst layer 182.

More specifically, the transparent conductive film 166 is formed on the thin film transistor substrate having the organic protective film 158 at the uppermost layer thereof by a deposition technique such as the sputtering, etc. In this case, the thin film transistor substrate is heated at a substrate temperature of about 100° C. to 200° C., thereby forming the transparent conductive film 166B above the organic protective film 158 into an amorphous substance. On the other hand, the transparent conductive film 166A above the inorganic material including the substrate 150 provided with the crystallization catalyst layer 182, the gate insulating film 152, the source/drain metal pattern and the semiconductor pattern is formed into a crystalline material. As a result, the crystalline transparent conductive film 166A is provided at a pixel area where the pixel electrode is to be formed and an inorganic material area including the first contact hole 164 of the gate pad portion and the second contact hole 162 of the data pad portion, whereas the amorphous transparent conductive film 166B is provided at the upper portion of the organic protective film 158 that is the remaining area. Herein, the crystalline transparent conductive film 166A has a crystallization rate accelerated by the crystallization catalyst layer 182 to thereby have a higher crystallization degree. Further, so as to prevent the transparent conductive film 166B on the organic protective film 158 from being grown from an amorphous substance into a crystalline substance, the transparent conductive film 166 is formed at a thickness of about 500 Å (angstroms) or less.

Figure 13D:
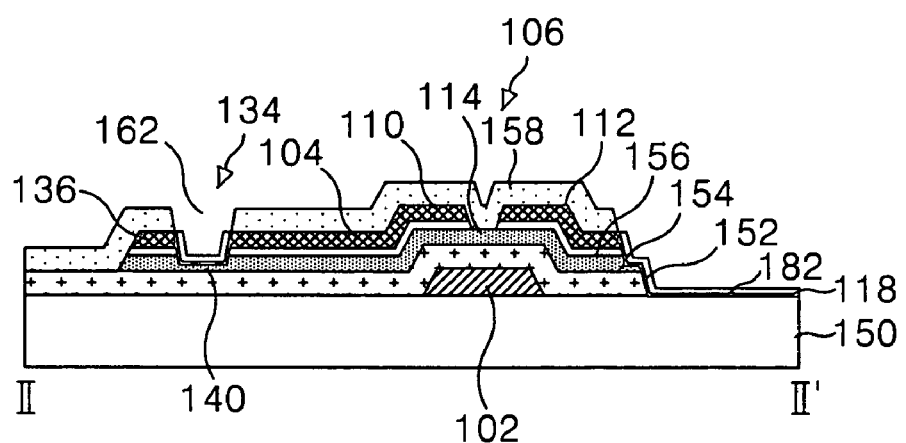
Figure 13D:
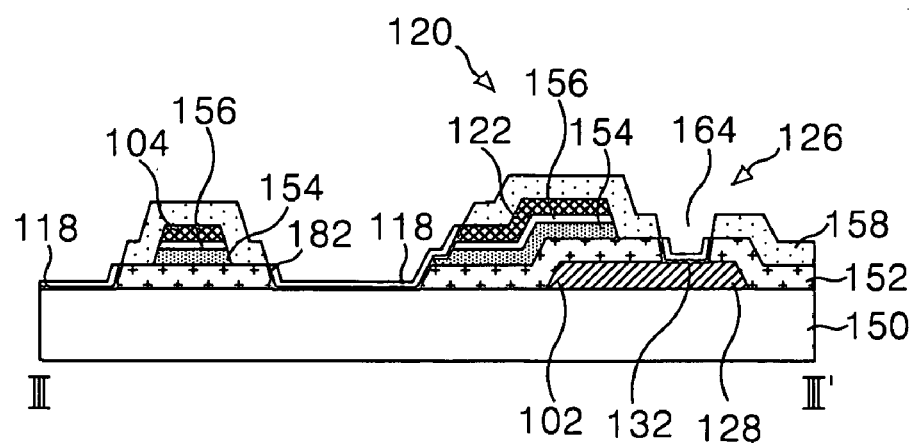

Referring to FIG. 13D, a transparent conductive film pattern including the pixel electrode 118, the gate pad upper electrode 132 and the data pad upper electrode 140 is provided by the selective etching process of the transparent conductive film 166.

More specifically, only the amorphous transparent conductive film 166B, of the transparent conductive film 166 divided into the crystalline transparent conductive film 166A and the amorphous transparent conductive film 166B, is selectively etched out with the aid of an etchant for amorphous substance containing a thin oxalic acid having a 10 weight % or less, whereas the crystalline transparent conductive film 166A is left. Accordingly, the pixel electrode 118, the gate pad upper electrode 132 and the data pad upper electrode 140 formed from the crystalline transparent conductive film 166A are provided. Such a crystalline transparent conductive film 166A including the pixel electrode 118, the gate pad upper electrode 132 and the data pad upper electrode 140, that is, the transparent conductive film pattern makes an interface with the organic protective film 158 without any overlaps as shown in FIG. 13D. As the crystalline transparent conductive film 166A has a higher crystallization degree with the aid of the crystallization catalyst layer 182 to have a large etching rate difference from the amorphous transparent conductive layer 166B, it is stably left without any damages caused by the etchant for amorphous substance.

Figure 14:
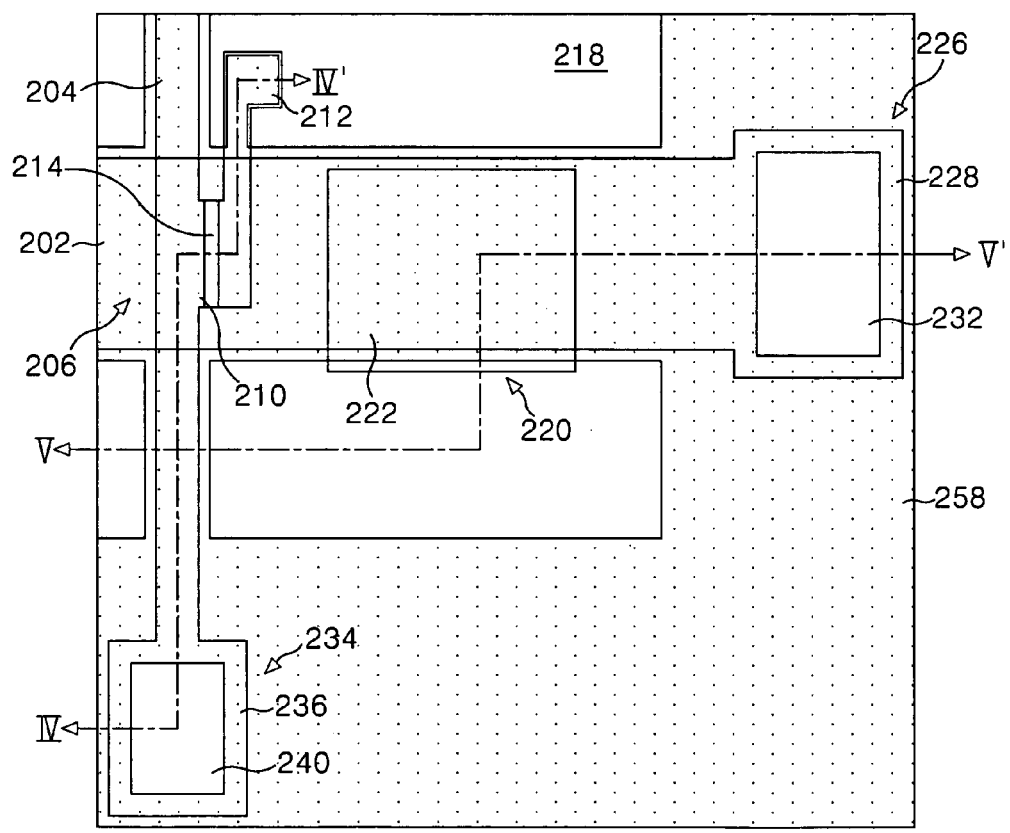
FIG. 14 is a plan view showing a thin film transistor substrate according to a third embodiment of the present invention.
Figure 15:
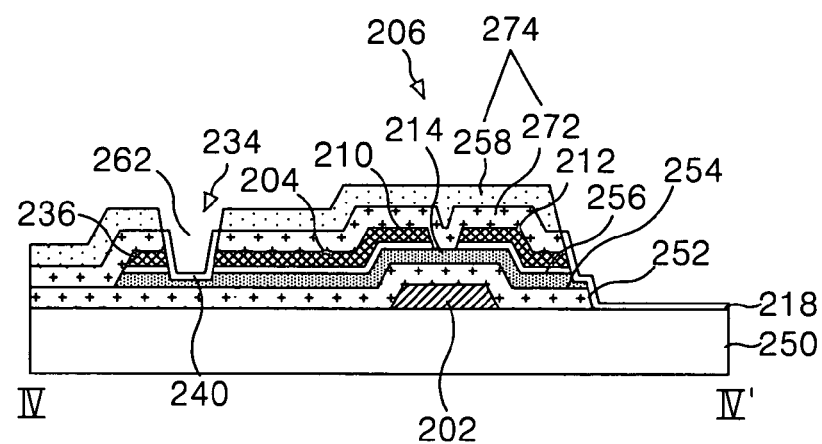
FIG. 15 is a section view of the thin film transistor substrate taken along the IV-IV' line and the V-V' line in FIG. 14.
Figure 15:
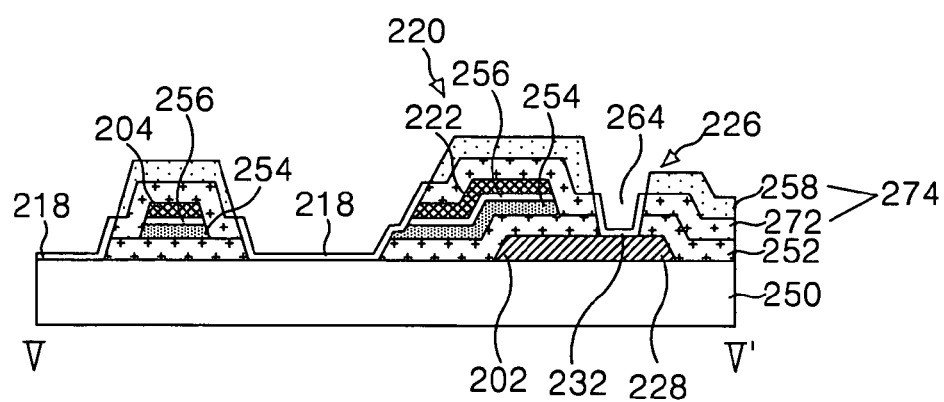

FIG. 14 is a plan view of a thin film transistor substrate according to a third embodiment of the present invention, and FIG. 15 is a section view of the thin film transistor substrate taken along the IV-IV' line and the V-V' line in FIG. 14.

The thin film transistor substrate shown in FIG. 14 and FIG. 15 has the same elements as the above-mentioned thin film transistor substrate shown in FIG. 6 and FIG. 7 except that a protective film 274 has a double-layer structure of an organic protective film 258 and an inorganic protective film 272, and a transparent conductive film pattern is extended into the side surface of the inorganic protective film 272. Accordingly, a brief explanation as to the same elements will be made below.

The thin film transistor 206 includes a gate electrode included in the gate line 202, a source electrode 210 connected to the data line 204, a drain electrode 212 positioned in opposition to the source electrode 210 and connected to the pixel electrode 218, and an active layer 254 formed on a gate insulating film 252 overlapping with the gate line 202 in such a manner to overlap with the source electrode 210 and the drain electrode 212 to thereby define a channel 214.

The active layer 254 also overlaps with the data pad lower electrode 236, the storage upper electrode 222 and the data line 204. On the active layer 254, an ohmic contact layer 256 for make an ohmic contact with the data pad lower electrode 236, the storage upper electrode 222, the data line 204, the source electrode 210 and the drain electrode 212 is further provided.

The storage capacitor 220 consists of a pre-stage gate line 202, and a storage upper electrode 222 overlapping with the gate line 202 with having the gate insulating film 252, the active layer 254 and the ohmic contact layer 256 therebetween and connected to the pixel electrode 218.

The gate pad portion 226 consists of a gate pad lower electrode 228 extended from the gate line 202, and a gate pad upper electrode 232 connected above the gate pad lower electrode 228. Herein, the gate pad upper electrode 232 is formed within a first contact hole 264 passing through the protective film 274 and the gate insulating film 252.

The data pad portion 234 consists of a data pad lower electrode 236 extended from the data line 204, and a data pad upper electrode 240 connected to the data pad lower electrode 236. The data pad portion 234 further includes the gate insulating film 252, the active layer 254 and the ohmic contact layer 256 that are provided between the data pad lower electrode 236 and the lower substrate 250. In such a data pad portion 234, the data pad upper electrode 240 is formed within a second contact hole 262 passing through the protective film 274 and the data pad lower electrode 236 to thereby make a side contact with the data pad lower electrode 236.

The protective film 274 has a double-layer structure in which the inorganic protective film 272 and the inorganic protective film 258 is built. Herein, the inorganic protective film 272 allows a transparent conductive pattern including the pixel electrode 218, the gate pad upper electrode 232 and the data pad upper electrode 240 to be coated onto the side surface of the inorganic protective film 272. Thus, the inorganic protective film 272 prevents a badness caused by an exposure of the source/drain metal pattern through an interface portion with the transparent conductive pattern making an interface with the organic protective film 258 without any overlaps by the above-mentioned selective etching method of the transparent conductive film.

Figure 16A:
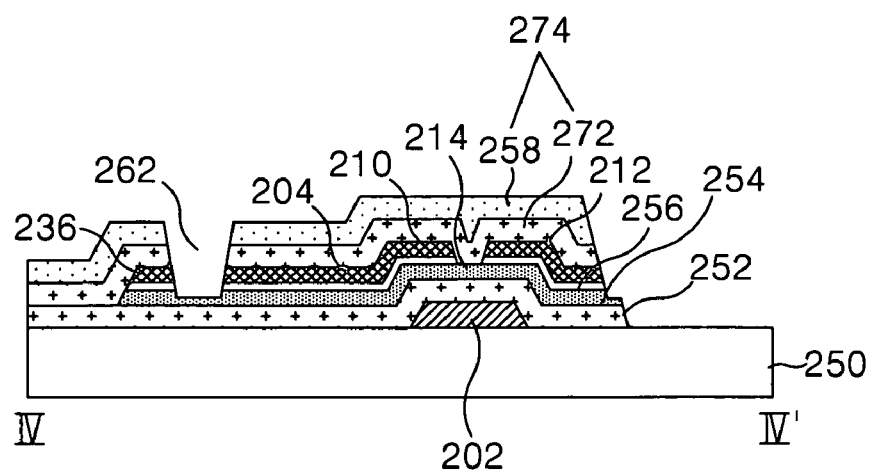
FIG. 16A to FIG. 16C are section views for explaining a third mask process and a selective etching process for a transparent conductive film in a method of manufacturing a thin film transistor substrate according to a third embodiment of the present invention.
Figure 16A:
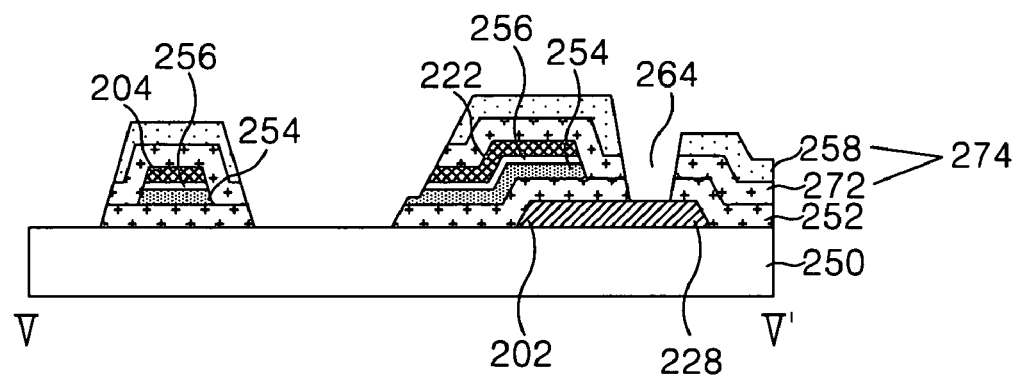
Figure 16B:
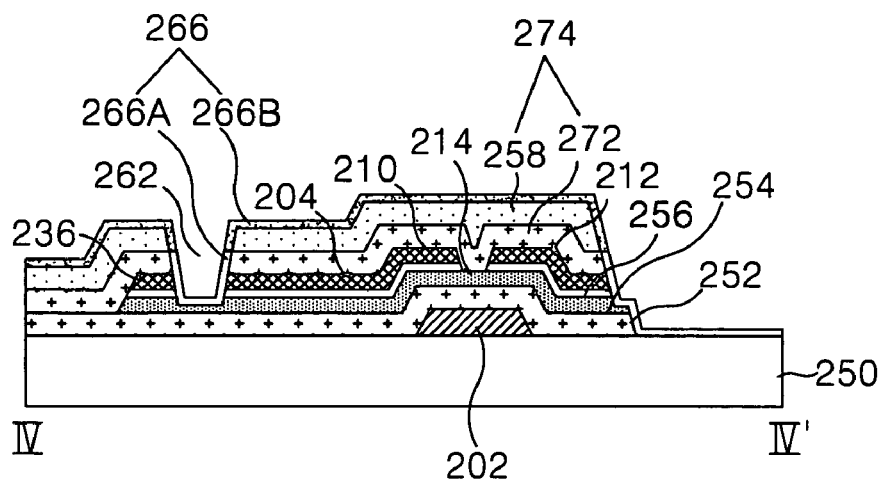
Figure 16B:
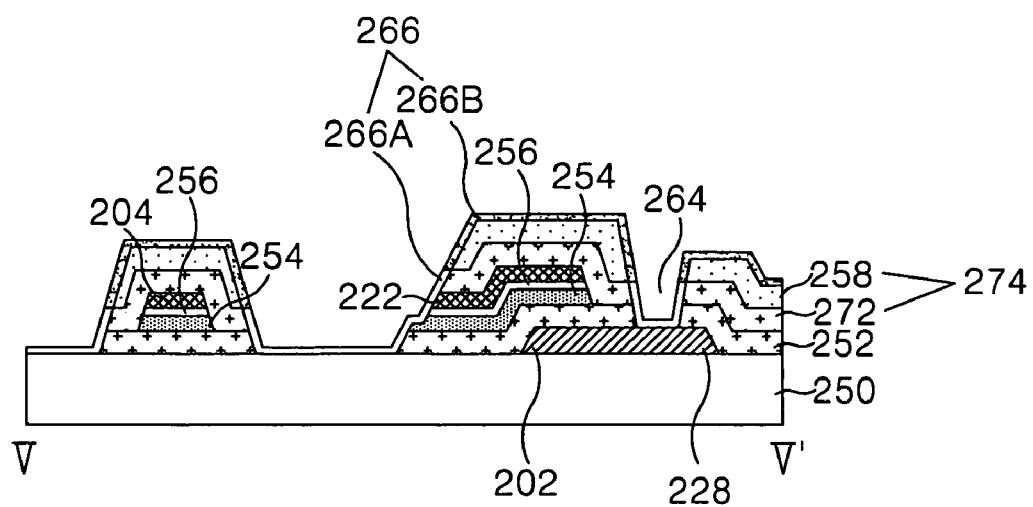
Figure 16C:
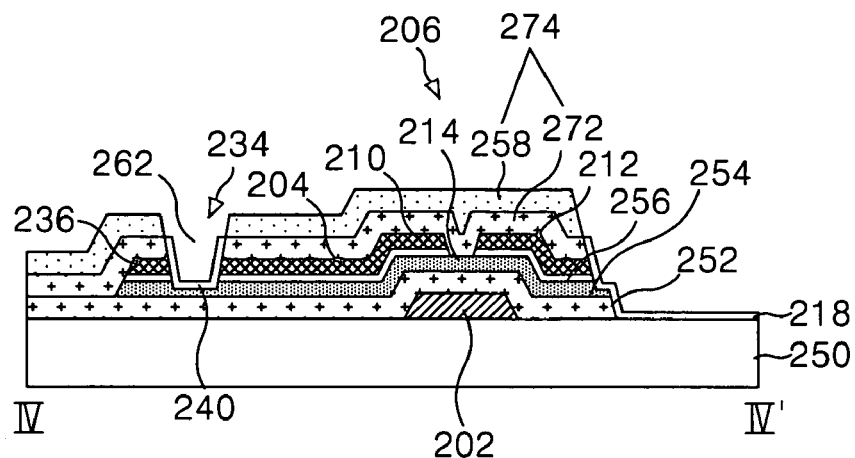
Figure 16C:
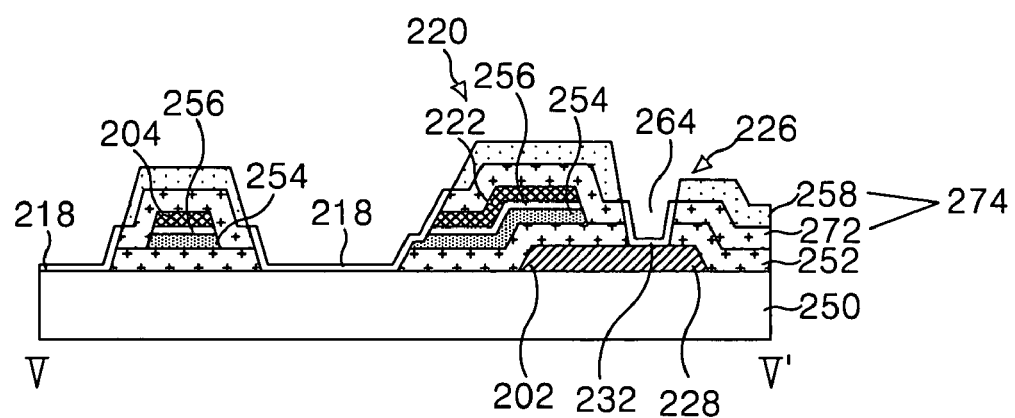

FIG. 16A to FIG. 16C are section views for explaining a third mask process and a selective etching process, respectively, in a method of manufacturing a thin film transistor substrate according to a third embodiment of the present invention.

The first and second mask processes in the method of manufacturing the thin film transistor substrate according to the third embodiment of the present invention are identical to the above-mentioned processes.

Referring to FIG. 16A, the protective film 274 consisting of the inorganic protective film 272 and the organic protective film 258 are formed at the uppermost layer of the thin film transistor substrate and the gate insulating film 252 is patterned along with the protective film 272 by the third mask process.

More specifically, the inorganic protective film 272 is entirely formed on the gate insulating film 252 on which the semiconductor pattern and the source/drain metal pattern are disposed by the deposition technique such as the PECVD, etc., and the organic protective film 258 is entirely coated thereon. The inorganic protective film 272 is formed from the same material as the gate insulating film 252, whereas the organic protective film 258 is formed from an organic insulating material having a small dielectric constant such as an acrylic organic compound, BCB (benzocyclobutene) or PFCB (perfluorocyclobutane), etc.

Subsequently, the protective film 274 and the gate insulating film 252 positioned beneath it are patterned by and the photolithography and the etching process using a third mask. Thus, in the following process, the protective film 274 and the gate insulating film 252 at a pixel area where the pixel electrode 218 is to be formed are removed to thereby have an exposed structure of the substrate 250. Further, the gate pad portion is provided with the first contact hole 264 passing through the protective film 274 and the gate insulating film 252 to thereby have an exposed structure of the gate pad lower electrode 228. The data pad portion is provided with the second contact hole 262 passing through the protective film 274, the data pad lower electrode 236 and the ohmic contact layer 256 to thereby have an exposed structure of the active layer 254.

Referring to FIG. 16B, the transparent conductive film 266 divided into an amorphous transparent conductive film 266B and a crystalline transparent conductive film 266A are provided at a different crystallization rate depending upon a growth condition.

More specifically, the transparent conductive film 266 is formed on the thin film transistor substrate having the organic protective film 258 at the uppermost layer thereof by a deposition technique such as the sputtering, etc. In this case, the thin film transistor substrate is heated at a substrate temperature of about 100° C. to 200° C., thereby forming the transparent conductive film 266B above the organic protective film 258 into an amorphous substance. On the other hand, the transparent conductive film 266A above the inorganic material including the substrate 250, the gate insulating film 252, the source/drain metal pattern, the semiconductor pattern and the inorganic protective film 272 is formed into a crystalline material. Further, so as to prevent the transparent conductive film 266B on the organic protective film 258 from being grown from an amorphous substance into a crystalline substance, the transparent conductive film 266 is formed at a thickness of about 500 Å (angstroms) or less.

Herein, the transparent conductive film 266 is formed from indium-tin-oxide (ITO), tin-oxide (TO), indium-zinc-oxide (IZO) or SnO2.

Referring to FIG. 16C, a transparent conductive pattern including the pixel electrode 218, the gate pad upper electrode 232 and the data pad upper electrode 240 is provided by the selective etching process of the transparent conductive film 266.

More specifically, only the amorphous transparent conductive film 266B, of the transparent conductive film 266 divided into the crystalline transparent conductive film 266A and the amorphous transparent conductive film 266B, is selectively etched out with the aid of an etchant for amorphous substance. For example, the amorphous transparent conductive film 266B on the organic protective film 258 is selectively etched out by a wet etching process using an etchant for amorphous substance based on a thin oxalic acid (C2H2O4) having a 10 weight % or less, preferably a 3 to 5 weight % oxalic acid, while the crystalline transparent conductive film 266A is left.

Accordingly, the pixel electrode 218, the gate pad upper electrode 232 and the data pad upper electrode 240 formed from the crystalline transparent conductive film 266A are provided. Such a crystalline transparent conductive film 266A including the pixel electrode 218, the gate pad upper electrode 232 and the data pad upper electrode 240, that is, the transparent conductive film pattern is coated onto the side surface of the inorganic protective film 272, thereby making an interface with the organic protective film 258 without any overlaps.

FIG. 17A to FIG. 17D are section views for explaining a third mask process and a selective etching process of a transparent conductive film in a method of manufacturing a thin film transistor substrate according to a fourth embodiment of the present invention.

The method of manufacturing the thin film transistor substrate according to the fourth embodiment of the present invention further includes a step of forming a crystallization catalyst layer 282 for accelerating a crystalline rate of the transparent conductive film in comparison to the above-mentioned method of manufacturing the thin film transistor substrate according to the third embodiment of the present invention. Herein, the first and second mask processes are identical to the above-mentioned processes.

Figure 17A:
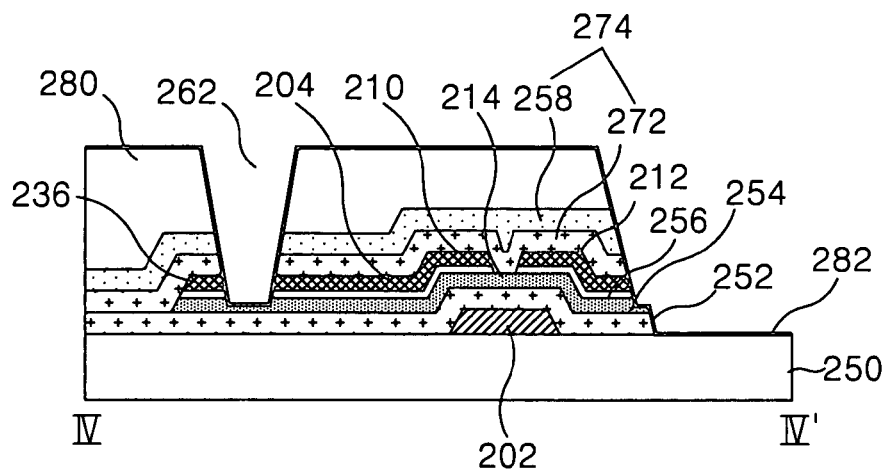
FIG. 17A to FIG. 17D are section views for explaining a third mask process and a selective etching process for a transparent conductive film in a method of manufacturing a thin film transistor substrate according to a fourth embodiment of the present invention.
Figure 17A:
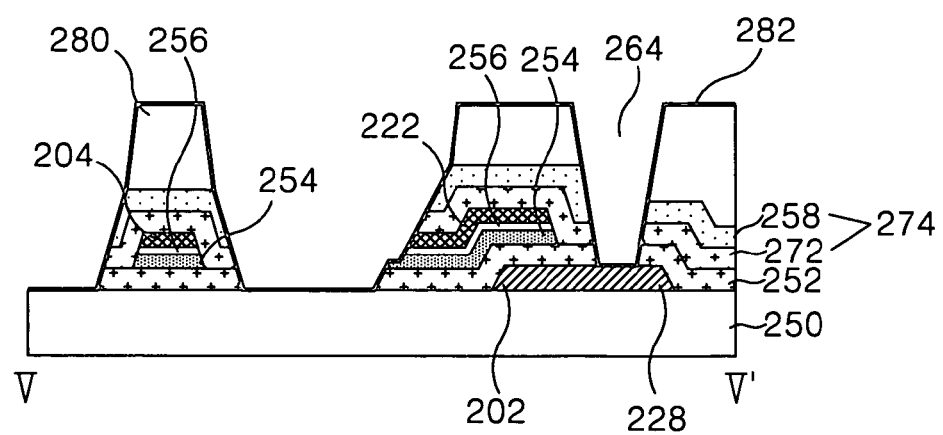

Referring to FIG. 17A, the protective film 274 consisting of the inorganic protective film 272 and the organic protective film 258 are formed at the uppermost layer of the thin film transistor substrate and the gate insulating film 252 is patterned along with the protective film 272 by the third mask process.

More specifically, the inorganic protective film 272 is entirely formed on the gate insulating film 252 on which the semiconductor pattern and the source/drain metal pattern are disposed by the deposition technique such as the PECVD, etc., and the organic protective film 258 is entirely coated thereon. Subsequently, the protective film 274 and the gate insulating film 252 positioned beneath it are patterned by the etching process using the photo-resist pattern 280 formed by the photolithography employing a third mask. Thus, in the following process, the protective film 274 and the gate insulating film 252 at a pixel area where the pixel electrode 218 is to be formed are removed to thereby have an exposed structure of the substrate 250. Further, the gate pad portion is provided with the first contact hole 264 passing through the protective film 274 and the gate insulating film 252 to thereby have an exposed structure of the gate pad lower electrode 228. The data pad portion is provided with the second contact hole 262 passing through the protective film 274, the data pad lower electrode 236 and the ohmic contact layer 256 to thereby have an exposed structure of the active layer 254.

Next, a crystallization catalyst layer 282 is entirely formed on the thin film transistor substrate at which the photo-resist pattern 280 has been left. The crystallization catalyst layer 282 is formed from a refractory metal such as Ni, Cu, In, Sn, Mo, Tn, W, Cr or Hf, etc. Metal atoms of such a crystallization catalyst layer 282 are formed on a sparsely basis to make a nucleus production cite for accelerating a crystallization of the transparent conductive film to be formed thereon.

Figure 17B:
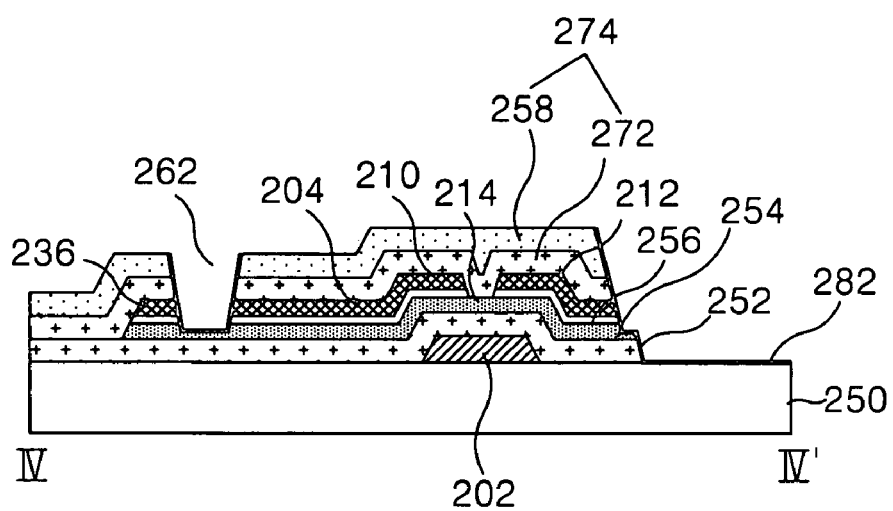
Figure 17B:
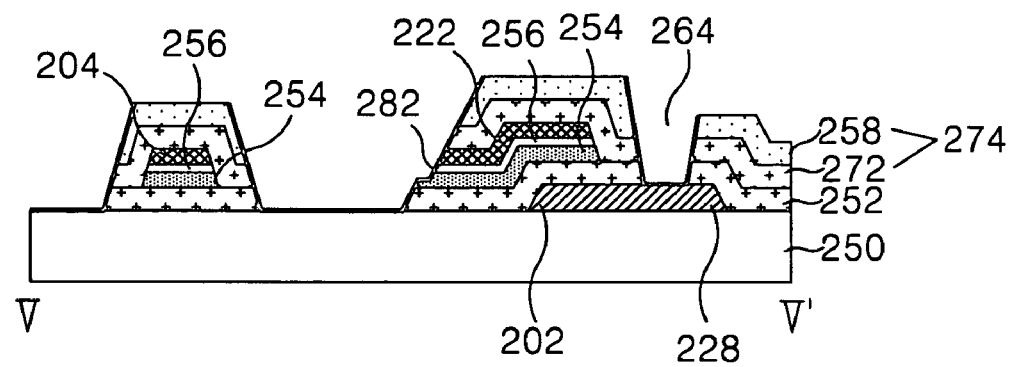

Referring to FIG. 17B, the photo-resist pattern 280 is removed along with the crystallization catalyst layer 282 formed thereon by the stripping process or the lift-off process. Thus, the crystallization catalyst layer 282 is left only at the remaining area excluding the organic protective film 258 from the thin film transistor substrate, that is, the inorganic material area.

Figure 17C:
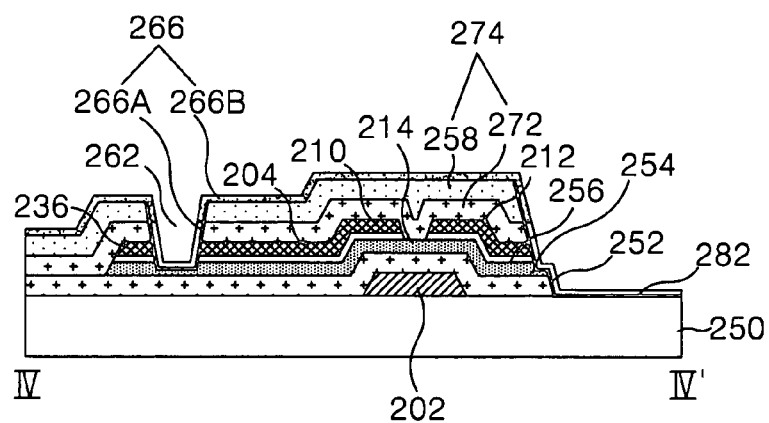
Figure 17C:
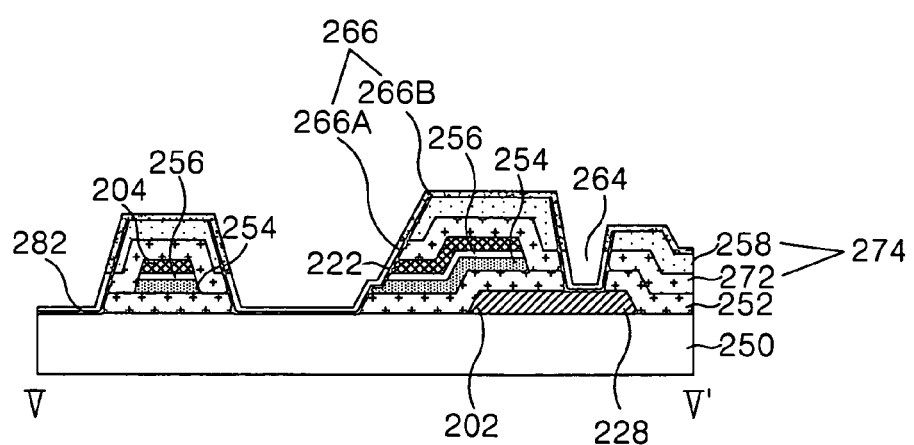

Referring to FIG. 17C, the transparent conductive film 266 divided into an amorphous transparent conductive film 266B and a crystalline transparent conductive film 266A are provided on the organic protective film 258 and the crystallization catalyst layer 282.

More specifically, the transparent conductive film 266 is formed on the thin film transistor substrate having the organic protective film 258 at the uppermost layer thereof by a deposition technique such as the sputtering, etc. In this case, the thin film transistor substrate is heated at a substrate temperature of about 100° C. to 200° C., thereby forming the transparent conductive film 266B above the organic protective film 258 into an amorphous substance. On the other hand, the transparent conductive film 266A above the inorganic material including the substrate 250 provided with the crystallization catalyst layer 282, the gate insulating film 252, the source/drain metal pattern, the semiconductor pattern and the inorganic protective film 272 is formed into a crystalline material. As a result, the crystalline transparent conductive film 266A is provided at a pixel area where the pixel electrode is to be formed and an inorganic material area including the first contact hole 264 of the gate pad portion and the second contact hole 262 of the data pad portion, whereas the amorphous transparent conductive film 266B is provided at the upper portion of the organic protective film 258 that is the remaining area. Herein, the crystalline transparent conductive film 266A has a crystallization rate accelerated by the crystallization catalyst layer 282 to thereby have a higher crystallization degree. Further, so as to prevent the transparent conductive film 266B on the organic protective film 258 from being grown from an amorphous substance into a crystalline substance, the transparent conductive film 266 is formed at a thickness of about 500 Å (angstroms) or less.

Figure 17D:
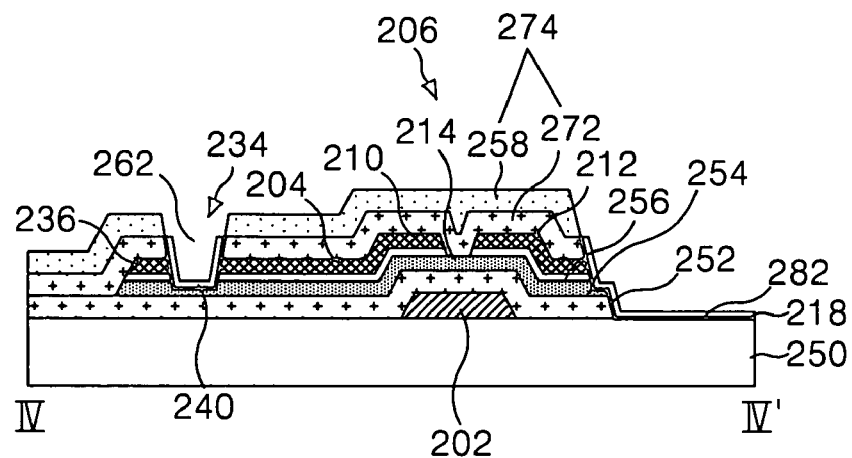
Figure 17D:
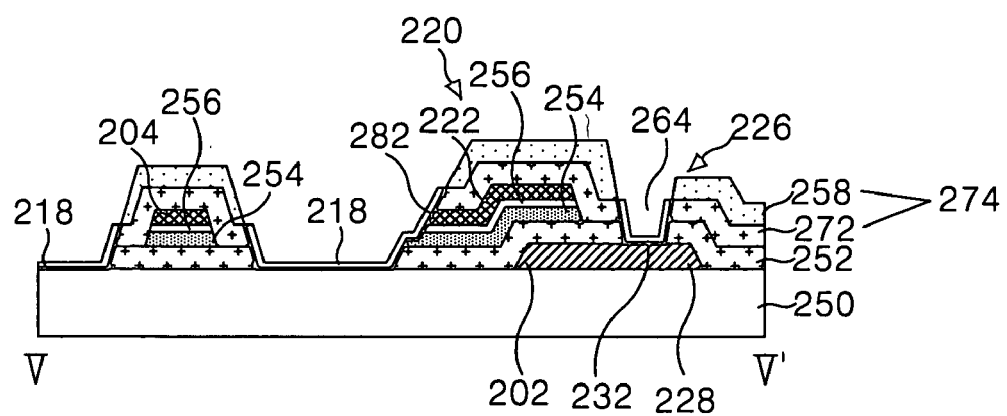

Referring to FIG. 17D, a transparent conductive pattern including the pixel electrode 218, the gate pad upper electrode 232 and the data pad upper electrode 240 is provided by the selective etching process of the transparent conductive film 266.

More specifically, only the amorphous transparent conductive film 266B, of the transparent conductive film 266 divided into the crystalline transparent conductive film 266A and the amorphous transparent conductive film 266B, is selectively etched out with the aid of an etchant for amorphous substance containing a thin oxalic acid having a 10 weight % or less, whereas the crystalline transparent conductive film 266A is left. Accordingly, the pixel electrode 218, the gate pad upper electrode 232 and the data pad upper electrode 240 formed from the crystalline transparent conductive film 266A are provided. Such a crystalline transparent conductive film 266A including the pixel electrode 218, the gate pad upper electrode 232 and the data pad upper electrode 240, that is, the transparent conductive film pattern is coated onto the side surface of the inorganic protective film 272, thereby making an interface with the organic protective film 258 without any overlaps. As the crystalline transparent conductive film 266A has a higher crystallization degree with the aid of the crystallization catalyst layer 282 to have a large etching rate difference from the amorphous transparent conductive layer 266B, it is stably left without any damages caused by the etchant for amorphous substance.

Figure 18:
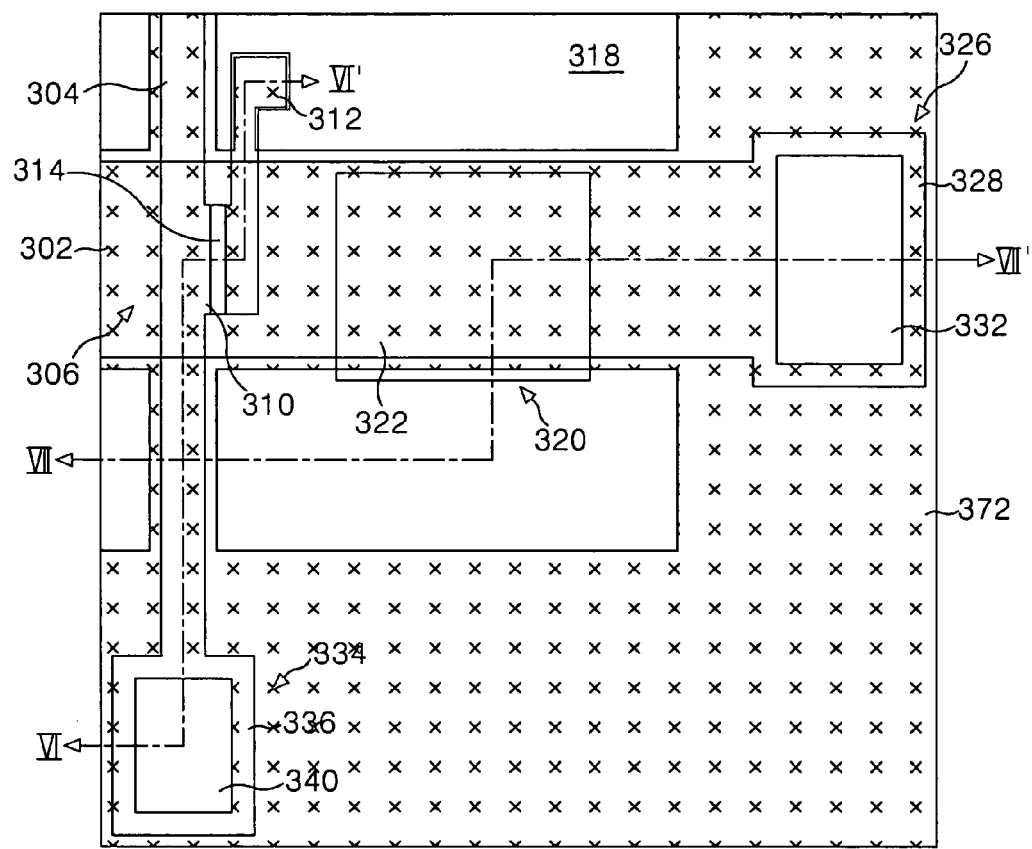
FIG. 18 is a plan view showing a thin film transistor substrate according to a fifth embodiment of the present invention.
Figure 19:
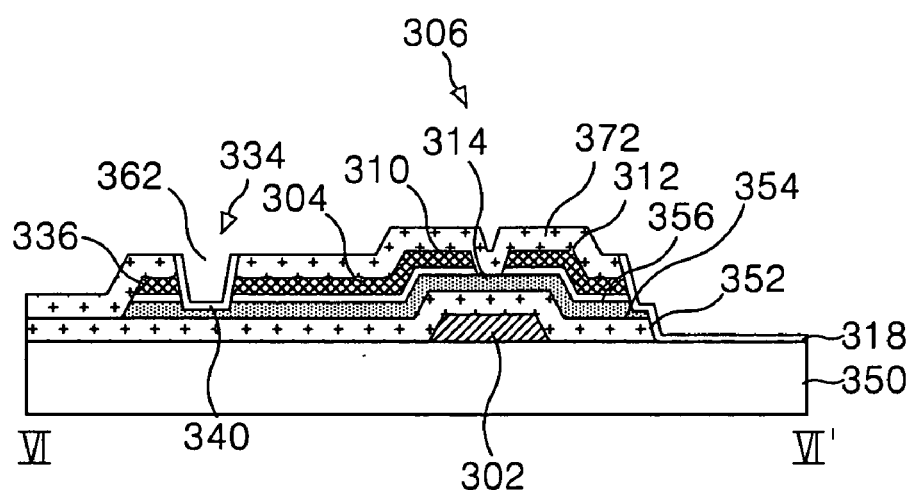
FIG. 19 is a section view of the thin film transistor substrate taken along the VI-VI' line and the VII-VII' line in FIG. 18.
Figure 19:
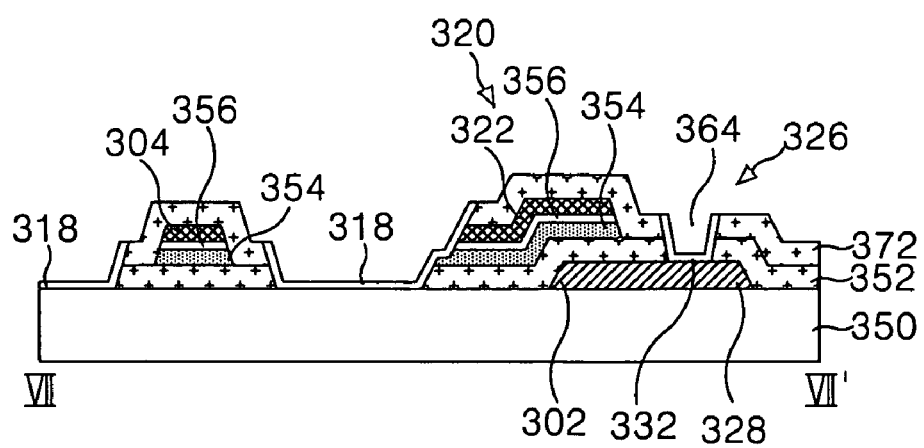

FIG. 18 is a plan view of a thin film transistor substrate according to a fifth embodiment of the present invention, and FIG. 19 is a section view of the thin film transistor substrate taken along the VI-VI' line and the VII-VII' line in FIG. 18.

The thin film transistor substrate shown in FIG. 18 and FIG. 19 has the same elements as the above-mentioned thin film transistor substrate shown in FIG. 14 and FIG. 15 except that a protective film has a single-layer structure of an inorganic protective film 372. Accordingly, a brief explanation as to the same elements will be made below.

The thin film transistor 306 includes a gate electrode included in the gate line 302, a source electrode 310 connected to the data line 304, a drain electrode 312 positioned in opposition to the source electrode 310 and connected to the pixel electrode 318, and an active layer 354 formed on a gate insulating film 352 overlapping with the gate line 302 in such a manner to overlap with the source electrode 310 and the drain electrode 312 to thereby define a channel 314.

The active layer 354 also overlaps with the data pad lower electrode 36, the storage upper electrode 32 and the data line 34. On the active layer 34, an ohmic contact layer 36 for make an ohmic contact with the data pad lower electrode 36, the storage upper electrode 32, the data line 34, the source electrode 310 and the drain electrode 312 is further provided.

The storage capacitor 320 consists of a pre-stage gate line 302, and a storage upper electrode 322 overlapping with the gate line 302 with having the gate insulating film 352, the active layer 354 and the ohmic contact layer 356 therebetween and connected to the pixel electrode 318.

The gate pad portion 326 consists of a gate pad lower electrode 328 extended from the gate line 302, and a gate pad upper electrode 332 connected above the gate pad lower electrode 328. Herein, the gate pad upper electrode 332 is formed within a first contact hole 364 passing through the inorganic protective film 372 and the gate insulating film 352.

The data pad portion 334 consists of a data pad lower electrode 336 extended from the data line 304, and a data pad upper electrode 340 connected to the data pad lower electrode 336. The data pad portion 334 further includes the gate insulating film 352, the active layer 354 and the ohmic contact layer 356 that are provided between the data pad lower electrode 336 and the lower substrate 350. In such a data pad portion 334, the data pad upper electrode 340 is formed within a second contact hole 362 passing through the inorganic protective film 372 and the data pad lower electrode 336 to thereby make a side contact with the data pad lower electrode 336.

The inorganic protective film 372 is formed from the same inorganic insulating material as the gate insulating film 352. Such an inorganic protective film 372 allows a transparent conductive pattern including the pixel electrode 318, the gate pad upper electrode 332 and the data pad upper electrode 340 to be coated onto the side surface of the inorganic protective film 372. Thus, if the above-mentioned selective etching method is used, then the inorganic protective film 372 prevents a badness caused by an exposure of the source/drain metal pattern along with the transparent conductive pattern.

FIG. 20A to FIG. 20D are section views for explaining a third mask process and a selective etching process, respectively, in a method of manufacturing a thin film transistor substrate according to a fifth embodiment of the present invention.

The first and second mask processes in the method of manufacturing the thin film transistor substrate according to the fifth embodiment of the present invention are identical to the above-mentioned processes.

Figure 20A:
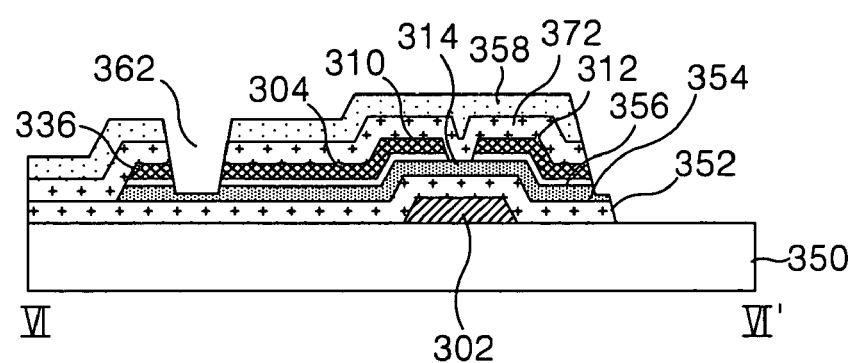
FIG. 20A to FIG. 20D are section views for explaining a third mask process and a selective etching process for a transparent conductive film in a method of manufacturing a thin film transistor substrate according to a fifth embodiment of the present invention.
Figure 20A:
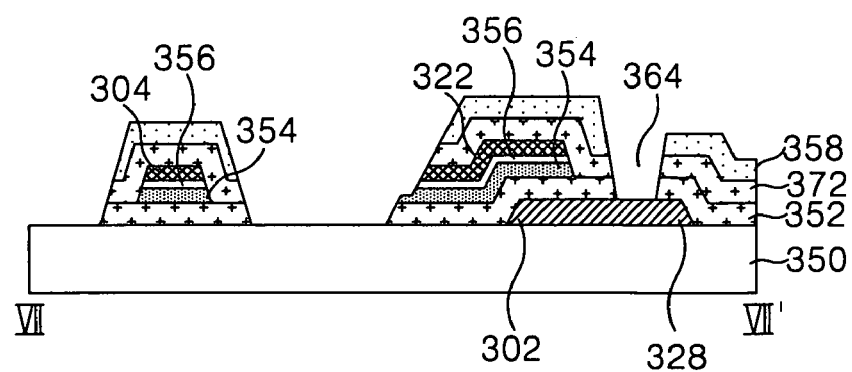

Referring to FIG. 20A, the inorganic protective film 372 and the organic film 358 are formed at the uppermost layer of the thin film transistor substrate and the gate insulating film 352 is patterned along with the inorganic protective film 372 and the organic film 358 by the third mask process.

More specifically, the inorganic protective film 372 is entirely formed on the gate insulating film 352 on which the semiconductor pattern and the source/drain metal pattern are disposed by the deposition technique such as the PECVD, etc., and the organic film 358 is entirely coated thereon. The inorganic protective film 372 is formed from the same material as the gate insulating film 352. The organic film 358 is formed from a photosensitive resin, for example a photoresist or a photo acrylic compound, etc. so that it can be easily removed in the post process.

Subsequently, the organic film 358 and the inorganic protective film 372 and the gate insulating film 352 positioned beneath them are patterned by and the photolithography and the etching process using a third mask. Thus, in the following process, the organic film 358, the inorganic protective film 372 and the gate insulating film 352 at a pixel area where the pixel electrode 318 is to be formed are removed to thereby have an exposed structure of the substrate 350. Further, the gate pad portion is provided with the first contact hole 264 passing through the organic film 358, the inorganic protective film 372 and the gate insulating film 352 to thereby have an exposed structure of the gate pad lower electrode 328. The data pad portion is provided with the second contact hole 358 passing through the organic film 358, the inorganic protective film 372, the data pad lower electrode 336 and the ohmic contact layer 356 to thereby have an exposed structure of the active layer 354.

Figure 20B:
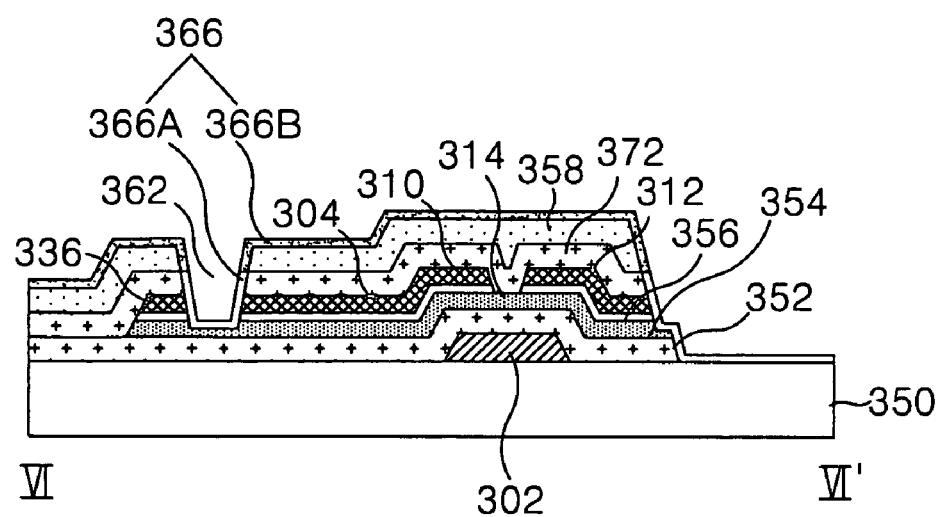
Figure 20B:
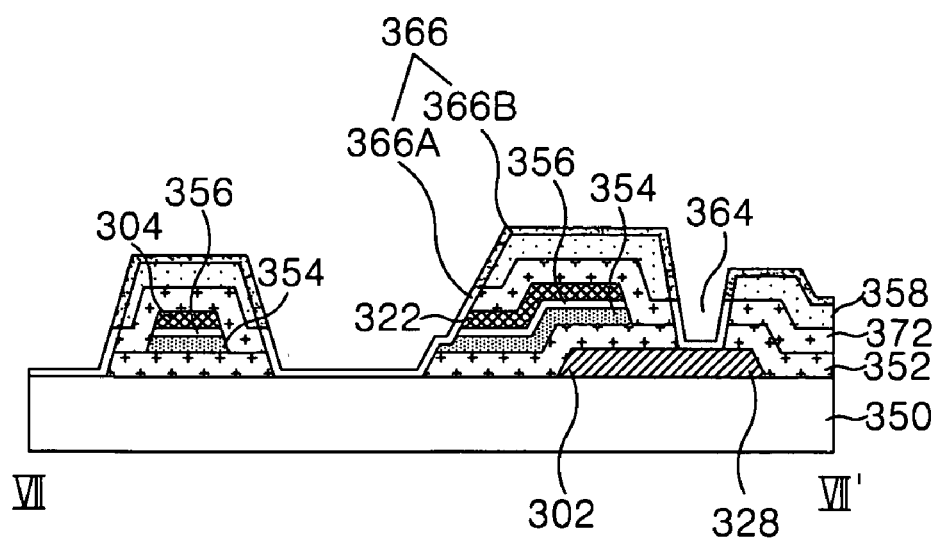

Referring to FIG. 20B, the transparent conductive film 366 divided into an amorphous transparent conductive film 366B and a crystalline transparent conductive film 366A is provided at a different crystallization rate depending upon a growth condition.

More specifically, the transparent conductive film 366 is formed on the thin film transistor substrate having the organic film 358 at the uppermost layer thereof by a deposition technique such as the sputtering, etc. In this case, the thin film transistor substrate is heated at a substrate temperature of about 100° C. to 200° C., thereby forming the transparent conductive film 366B above the organic film 358 into an amorphous substance. On the other hand, the transparent conductive film 366A above the inorganic material including the substrate 350, the gate insulating film 352, the source/drain metal pattern, the semiconductor pattern and the inorganic protective film 372 is formed into a crystalline material. Further, so as to prevent the transparent conductive film 366B on the organic film 358 from being grown from an amorphous substance into a crystalline substance, the transparent conductive film 366 is formed at a thickness of about 500 Å (angstroms) or less.

Herein, the transparent conductive film 366 is formed from indium-tin-oxide (ITO), tin-oxide (TO), indium-zinc-oxide (IZO) or SnO2.

Figure 20C:
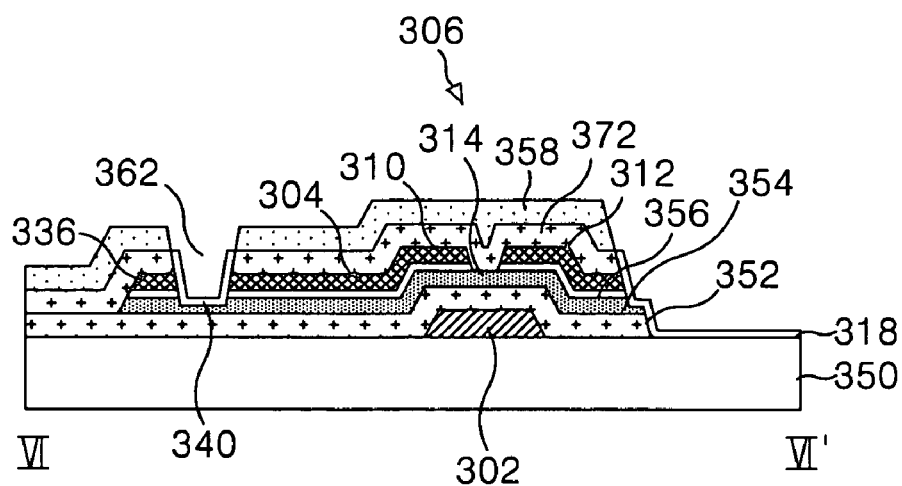
Figure 20C:
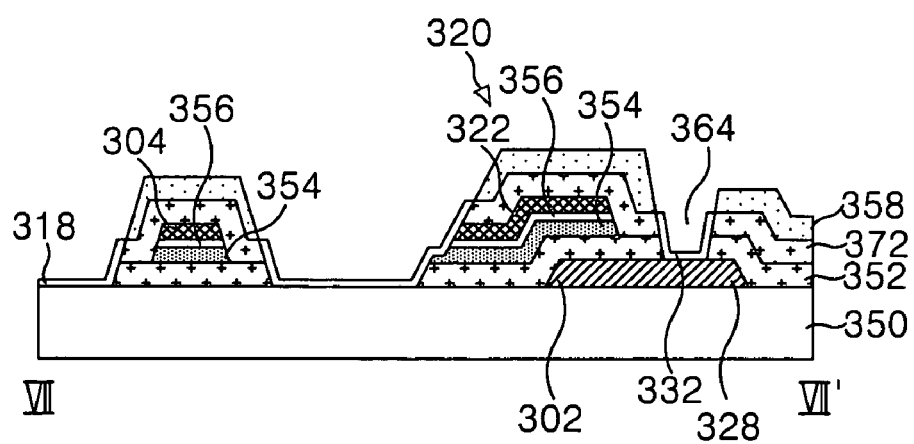

Referring to FIG. 20C, a transparent conductive pattern including the pixel electrode 318, the gate pad upper electrode 332 and the data pad upper electrode 340 is provided by the selective etching process of the transparent conductive film 366.

More specifically, only the amorphous transparent conductive film 366B, of the transparent conductive film 366 divided into the crystalline transparent conductive film 366A and the amorphous transparent conductive film 366B, is selectively etched out with the aid of an etchant for amorphous substance. Accordingly, the pixel electrode 318, the gate pad upper electrode 332 and the data pad upper electrode 340 formed from the crystalline transparent conductive film 366A are provided. Such a crystalline transparent conductive film 366A including the pixel electrode 318, the gate pad upper electrode 332 and the data pad upper electrode 340, that is, the transparent conductive film pattern is coated onto the side surface of the inorganic protective film 372, thereby making an interface with the organic film 358 without any overlaps.

Figure 20D:
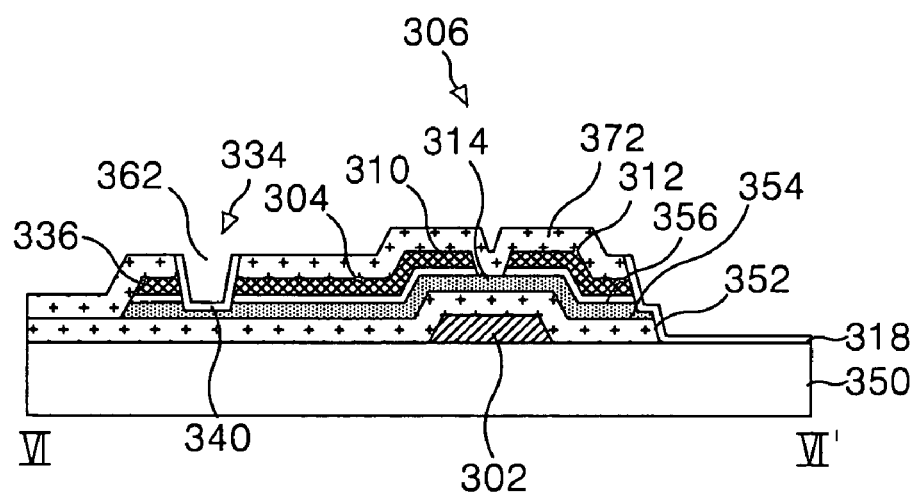
Figure 20D:
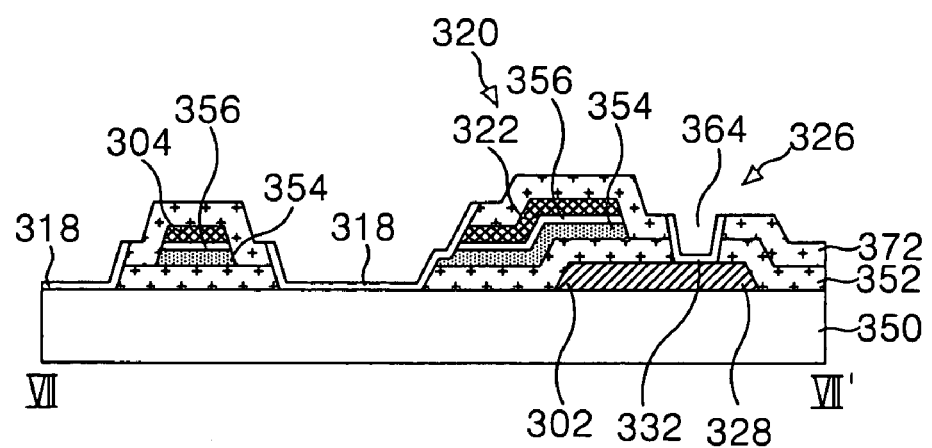

Referring to FIG. 20D, the organic film 358 making an interface with the transparent conductive pattern is removed by the stripping process. Accordingly, the protective film has a single-layer structure of the inorganic protective film 372.

FIG. 21A to FIG. 21E are section views for explaining a third mask process and a selective etching process of a transparent conductive film in a method of manufacturing a thin film transistor substrate according to a sixth embodiment of the present invention.

The method of manufacturing the thin film transistor substrate according to the sixth embodiment of the present invention further includes a step of forming a crystallization catalyst layer 382 for accelerating a crystalline rate of the transparent conductive film in comparison to the above-mentioned method of manufacturing the thin film transistor substrate according to the fifth embodiment of the present invention. Herein, the first and second mask processes are identical to the above-mentioned processes.

Figure 21A:
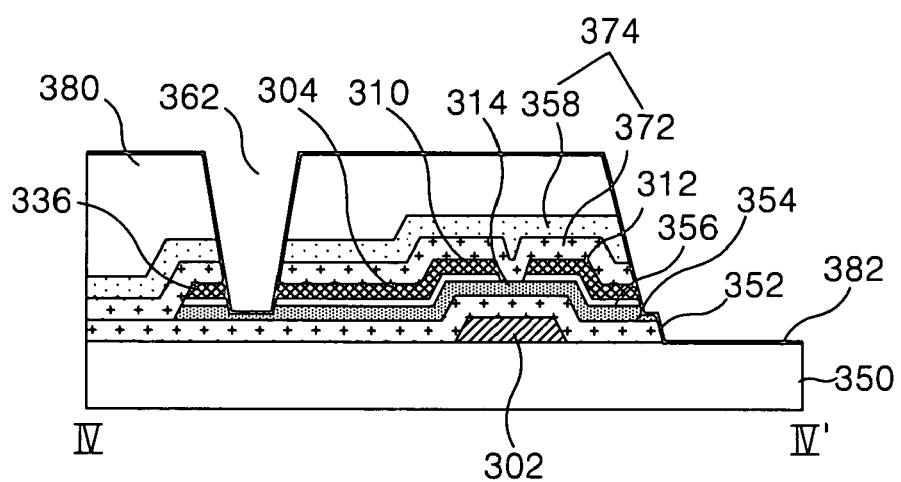
FIG. 21A to FIG. 21E are section views for explaining a third mask process and a selective etching process for a transparent conductive film in a method of manufacturing a thin film transistor substrate according to a sixth embodiment of the present invention.
Figure 21A:
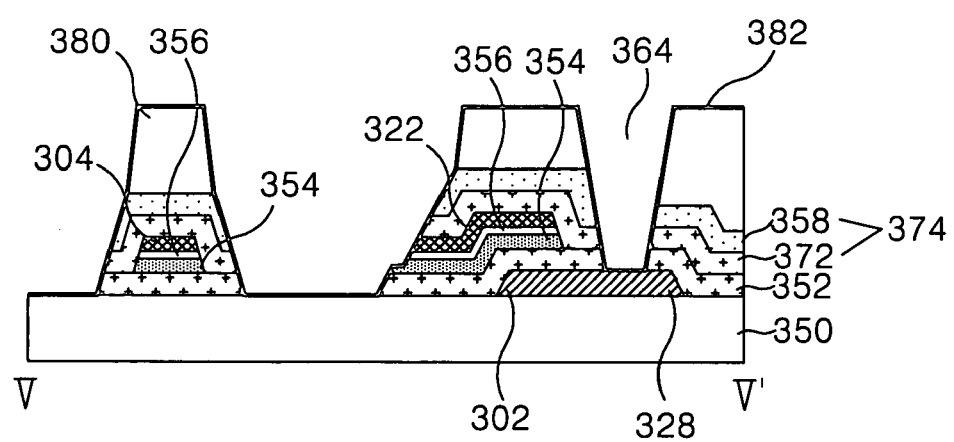

Referring to FIG. 21A, the protective film 374 consisting of the inorganic protective film 372 and the organic protective film 358 are formed at the uppermost layer of the thin film transistor substrate and the gate insulating film 352 is patterned along with the protective film 374 by the third mask process.

More specifically, the inorganic protective film 372 is entirely formed on the gate insulating film 352 on which the semiconductor pattern and the source/drain metal pattern are disposed by the deposition technique such as the PECVD, etc., and the organic protective film 358 is entirely coated thereon. Subsequently, the protective film 374 and the gate insulating film 352 positioned beneath it are patterned by the etching process using the photo-resist pattern 380 formed by the photolithography employing a third mask. Thus, in the following process, the protective film 374 and the gate insulating film 352 at a pixel area where the pixel electrode 318 is to be formed are removed to thereby have an exposed structure of the substrate 350. Further, the gate pad portion is provided with the first contact hole 364 passing through the protective film 374 and the gate insulating film 352 to thereby have an exposed structure of the gate pad lower electrode 328. The data pad portion is provided with the second contact hole 358 passing through the protective film 374, the data pad lower electrode 336 and the ohmic contact layer 356 to thereby have an exposed structure of the active layer 354.

Next, a crystallization catalyst layer 382 is entirely formed on the thin film transistor substrate at which the photo-resist pattern 380 has been left. The crystallization catalyst layer 382 is formed from a refractory metal such as Ni, Cu, In, Sn, Mo, Tn, W, Cr or Hf, etc. Metal atoms of such a crystallization catalyst layer 382 are formed on a sparsely basis to make a nucleus production cite for accelerating a crystallization of the transparent conductive film to be formed thereon.

Figure 21B:
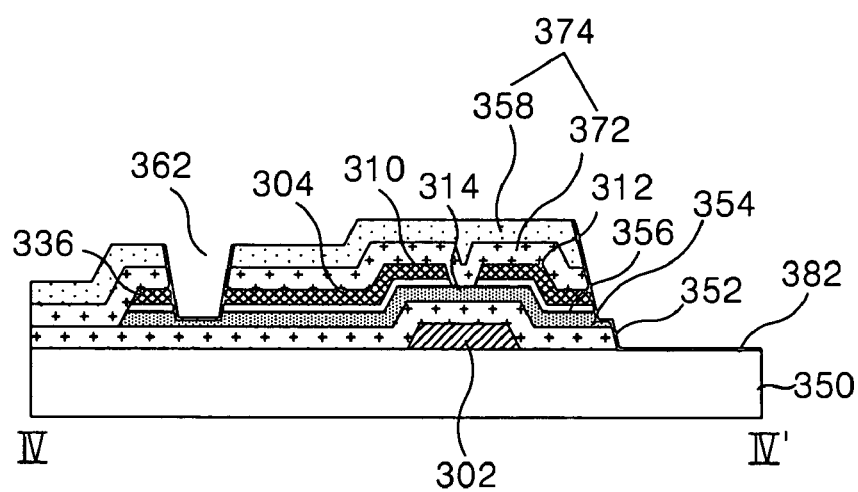
Figure 21B:
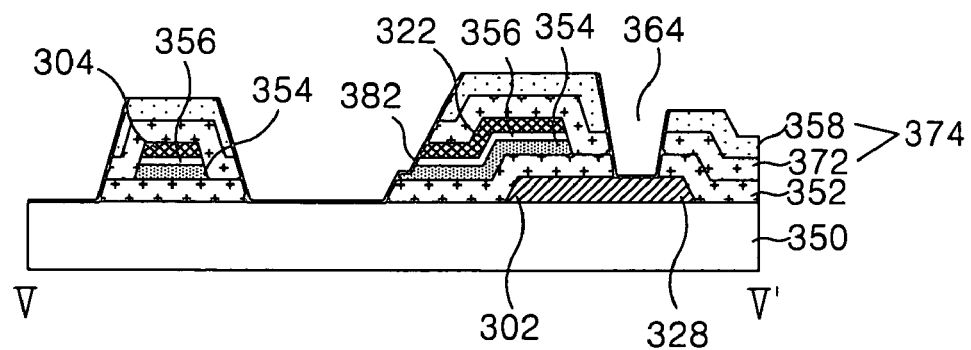

Referring to FIG. 21B, the photo-resist pattern 380 is removed along with the crystallization catalyst layer 382 formed thereon by the stripping process or the lift-off process. Thus, the crystallization catalyst layer 382 is left only at the remaining area excluding the organic protective film 358 from the thin film transistor substrate, that is, the inorganic material area.

Figure 21C:
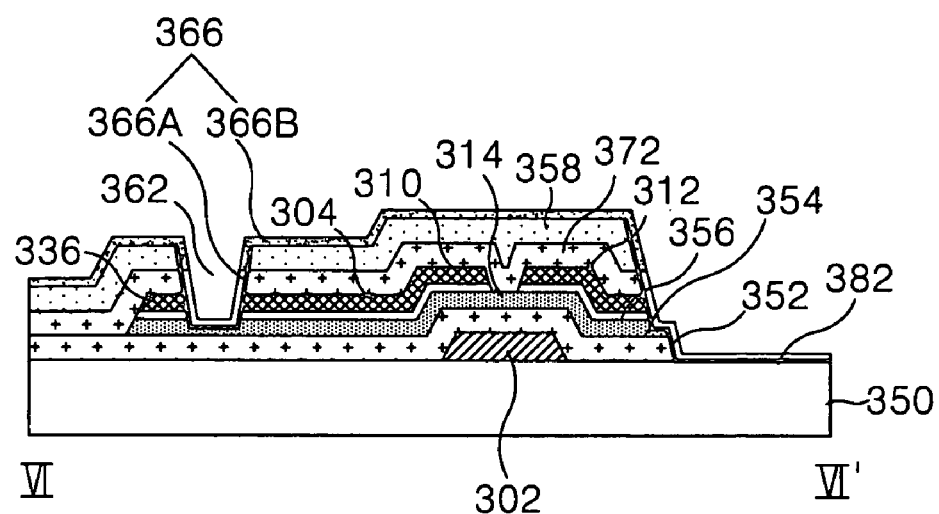
Figure 21C:
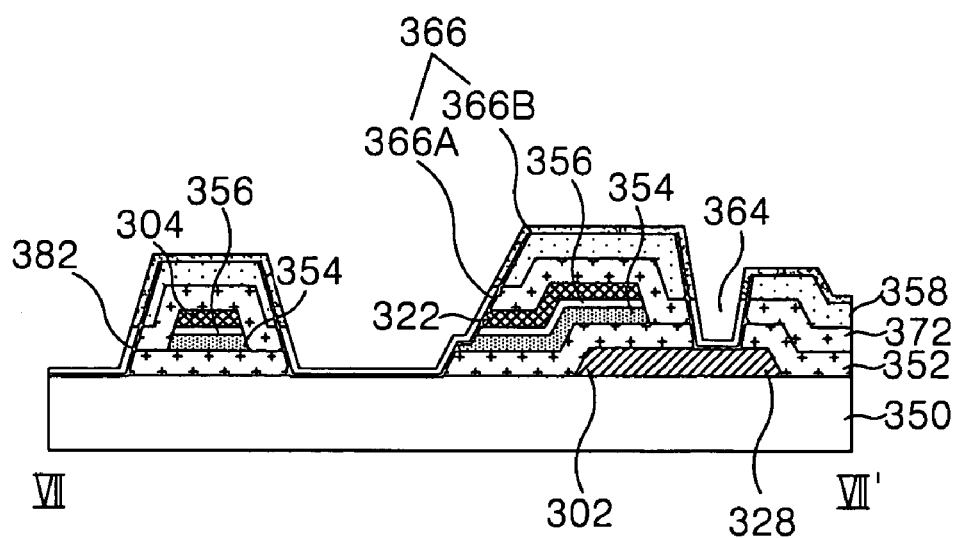

Referring to FIG. 21C, the transparent conductive film 366 divided into an amorphous transparent conductive film 366B and a crystalline transparent conductive film 366A are provided on the organic protective film 358 and the crystallization catalyst layer 382.

More specifically, the transparent conductive film 366 is formed on the thin film transistor substrate having the organic protective film 358 at the uppermost layer thereof by a deposition technique such as the sputtering, etc. In this case, the thin film transistor substrate is heated at a substrate temperature of about 100° C. to 200° C., thereby forming the transparent conductive film 366B above the organic protective film 358 into an amorphous substance. On the other hand, the transparent conductive film 366A above the inorganic material including the substrate 350 provided with the crystallization catalyst layer 382, the gate insulating film 352, the source/drain metal pattern, the semiconductor pattern and the inorganic protective film 372 is formed into a crystalline material. As a result, the crystalline transparent conductive film 366A is provided at a pixel area where the pixel electrode is to be formed and an inorganic material area including the first contact hole 364 of the gate pad portion and the second contact hole 362 of the data pad portion, whereas the amorphous transparent conductive film 366B is provided at the upper portion of the organic protective film 358 that is the remaining area. Herein, the crystalline transparent conductive film 366A has a crystallization rate accelerated by the crystallization catalyst layer 382 to thereby have a higher crystallization degree. Further, so as to prevent the transparent conductive film 366B on the organic protective film 358 from being grown from an amorphous substance into a crystalline substance, the transparent conductive film 366 is formed at a thickness of about 500 Å (angstroms) or less.

Figure 21D:
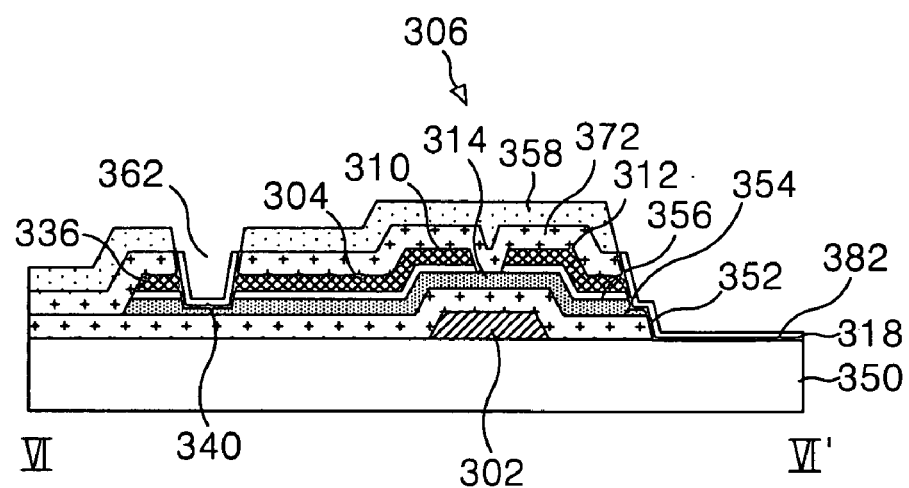
Figure 21D:
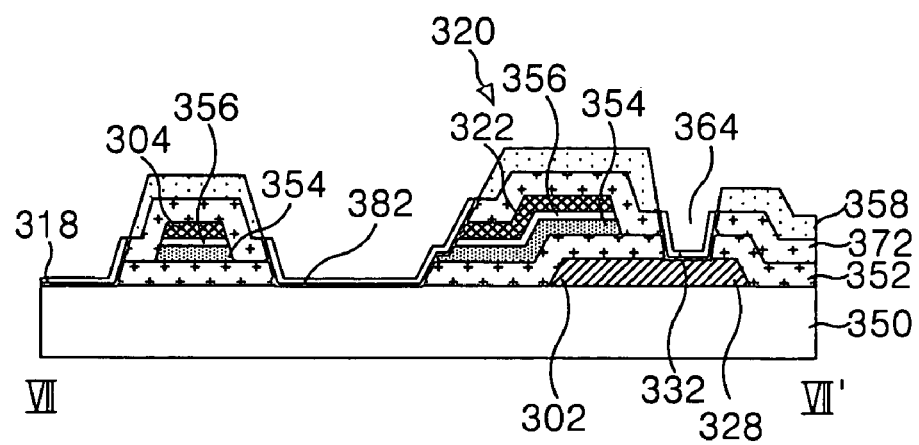

Referring to FIG. 21D, a transparent conductive pattern including the pixel electrode 318, the gate pad upper electrode 332 and the data pad upper electrode 340 is provided by the selective etching process of the transparent conductive film 366.

More specifically, only the amorphous transparent conductive film 366B, of the transparent conductive film 366 divided into the crystalline transparent conductive film 366A and the amorphous transparent conductive film 366B, is selectively etched out with the aid of an etchant for amorphous substance containing a thin oxalic acid having a 10 weight % or less, whereas the crystalline transparent conductive film 366A is left. Accordingly, the pixel electrode 318, the gate pad upper electrode 332 and the data pad upper electrode 340 formed from the crystalline transparent conductive film 366A are provided. Such a crystalline transparent conductive film 366A including the pixel electrode 318, the gate pad upper electrode 332 and the data pad upper electrode 340, that is, the transparent conductive film pattern is coated onto the side surface of the inorganic protective film 372, thereby making an interface with the organic protective film 358 without any overlaps. As the crystalline transparent conductive film 366A has a higher crystallization degree with the aid of the crystallization catalyst layer 382 to have a large etching rate difference from the amorphous transparent conductive layer 366B, it is stably left without any damages caused by the etchant for amorphous substance.

Figure 21E:
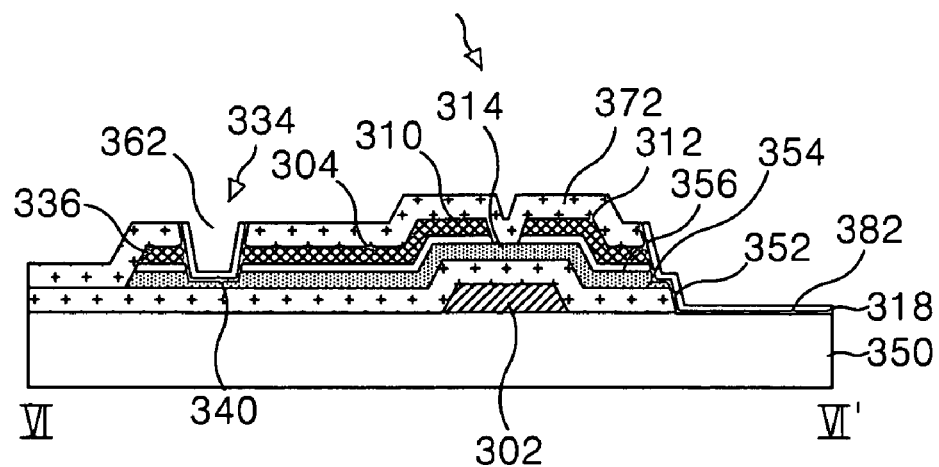
Figure 21E:
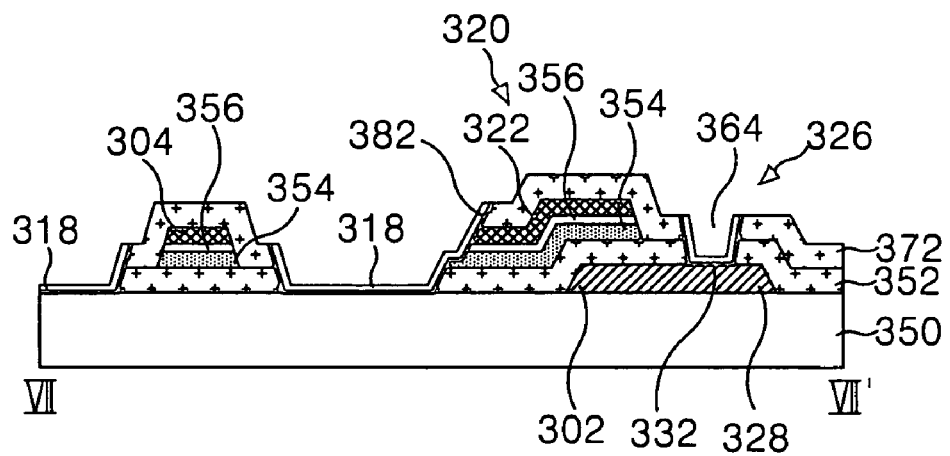

Referring to FIG. 21E, the organic protective film 358 making an interface with the transparent conductive pattern is removed by the stripping process. Accordingly, the protective film has a single-layer structure of the inorganic protective film 372.

As described above, the method of patterning the transparent conductive film according to the present invention selectively etches out the transparent conductive film at a different crystallization rate and thus does not require a separate mask process. Also, the method of patterning the transparent conductive film according to the present invention adopts the crystallization catalyst layer to more enhance a crystallization degree of the crystalline transparent conductive film, thereby assuring a stability of the transparent conductive film patterning process. Accordingly, the method of patterning the transparent conductive film according to the present invention can simplify the transparent conductive film patterning process.

Moreover, according to the present invention, the three mask process adopting said transparent conductive film patterning method is used to simplify the structure and the fabrication process of the thin film transistor substrate, thereby reducing the manufacturing cost, and the manufacturing yields can be improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

This application claims the benefit of Korean patent application number 2003-8159, filed Feb. 10, 2003, and Korean patent application number 2003-19782, filed Mar. 29, 2003, both of which are hereby incorporated by reference.

What is claimed is:

1. A method of fabricating a thin film transistor substrate for a display device, comprising:
   a first step of forming a gate line on a substrate;
   a second step of forming a gate insulating film covering the gate line;
   a third step of forming a semiconductor layer at a desired area on the gate insulating film;
   a fourth step of forming a data line crossing the gate line, a source electrode connected to the data line and a drain electrode opposed to the source electrode on the gate insulating film;
   a fifth step of forming a protective film in such a manner to cover the gate line, the data line, the source electrode and the drain electrode; and
   a sixth step of forming a pixel electrode making an interface with the protective film at the remaining area excluding an area where the protective film is formed and connected to a side surface of the drain electrode;
   wherein said protective film is any one of an organic insulating film, an inorganic insulating film and an inorganic/organic insulating film having a double-layer structure, and
   wherein said sixth step includes:
   coating a transparent conductive film formed into an amorphous substance on the protective film including an organic material while being formed into a crystalline substance at the remaining area formed from an inorganic material; and
   selectively etching the amorphous transparent conductive film on the protective film using an etchant for amorphous substance to thereby leave only the crystalline transparent conductive film.

2. The method as claimed in claim 1, further comprising the steps of:
   providing a gate pad lower electrode formed from the same material as the gate line;
   providing a contact hole passing through the protective film and the gate insulating film to expose the gate pad lower electrode; and
   providing a gate pad upper electrode formed from the same material as the pixel electrode and connected to the gate pad lower electrode through said contact hole.

3. The method as claimed in claim 1, further comprising the steps of:
   providing a data pad lower electrode formed from the same material as the data line on the gate insulating film;
   providing a contact hole passing through the protective film to expose the data pad lower electrode; and
   providing a data pad upper electrode formed from the same material as the pixel electrode and connected to the data pad lower electrode through said contact hole.

4. The method as claimed in claim 1, further comprising the step of:
   providing a storage upper electrode formed from the same material as the data line on the gate insulating film in such a manner to overlap with a portion of the gate line and making a side contact with the pixel electrode.

5. The method as claimed in claim 1, further comprising a step of forming a crystallization catalyst layer at the remaining area excluding an area where the protective film is formed between said fifth step and said sixth step.

6. The method as claimed in claim 5, wherein said fifth step includes:
   entirely forming the protective film on said substrate; and
   patterning the protective film by an etching process using a photo-resist pattern formed by the photolithography.

7. The method as claimed in claim 6, wherein said step of forming the crystallization catalyst layer includes:
   entirely forming the crystallization catalyst layer on said substrate in which the photo-resist pattern is formed on the protective film; and removing the crystallization catalyst layer on the photo-resist pattern along with the photo-resist pattern.

8. The method as claimed in claim 5, wherein said crystallization catalyst layer is formed such that metal atoms of at least one of refractory metals such as Ni, Cu, In, Sn, Mo, W, Cr and Hf have a distribution scattered on a sparsely basis.

9. A method of fabricating a thin film transistor substrate for a display device, comprising:
   a first mask process of forming a gate line using a first mask after forming a gate metal layer on a substrate;
   a process of disposing a gate insulating film, an amorphous silicon layer, an amorphous silicon layer doped with an impurity and a source/drain metal layer;
   a second mask process of patterning the source/drain metal layer, the amorphous silicon layer doped with said impurity and the amorphous silicon layer using a second mask to thereby provide a data line, a source electrode, a drain electrode and a semiconductor layer;
   a third mask process of etching out a protective film at a pixel area defined by an intersection between the gate line and the data line and the gate insulating film using a third mask after forming the protective film; and
   a process of selectively etching out a transparent conductive film on the protective film after forming the transparent conductive film to thereby provide a pixel electrode making an interface with the protective film and connected to a side surface of the drain electrode;
   wherein said step of forming the pixel electrode includes:
   coating the transparent conductive film formed into an amorphous substance on the protective film including an organic material while being formed into at the remaining area formed from an inorganic material; and
   selectively etching the amorphous transparent conductive film on the protective film using an etchant for amorphous substance to thereby leave only the crystalline transparent conductive film.

10. The method as claimed in claim 9, wherein said second mask process includes:
    forming a photo-resist pattern having a different thickness on a source/drain metal layer using said partially transmitting mask;
    patterning the source/drain metal layer, the amorphous silicon layer doped with said impurity and the amorphous silicon layer using the photo-resist pattern to thereby provide the data line, the drain electrode integral to the source electrode and the semiconductor layer;
    ashing the photo-resist pattern to remove a relatively thin photo-resist pattern;
    disconnecting the source electrode from the drain electrode through a portion at which said thin photo-resist pattern is removed and removing the amorphous silicon layer doped with said impurity; and
    removing the remaining photo-resist pattern.

11. The method as claimed in claim 9, further comprising the steps of:
    providing a gate pad lower electrode formed from the same material as the gate line by the first mask process;
    providing a contact hole passing through the protective film and the gate insulating film to expose the gate pad lower electrode by the third mask process; and
    providing a gate pad upper electrode formed from the same material as the pixel electrode and connected to the gate pad lower electrode through said contact hole.

12. The method as claimed in claim 9, further comprising the steps of:
    providing a data pad lower electrode formed from the same material as the data line on the gate insulating film by the second mask process;
    providing a contact hole passing through the protective film to expose the data pad lower electrode; and
    providing a data pad upper electrode formed from the same material as the pixel electrode and connected to the data pad lower electrode through said contact hole.

13. The method as claimed in claim 9, further comprising the step of:
    providing a storage upper electrode formed from the same material as the data line on the gate insulating film in such a manner to overlap with a portion of the gate line and making a side contact with the pixel electrode by the second mask process.

14. The method as claimed in claim 9, wherein said protective film is formed from an organic insulating film.

15. The method as claimed in claim 9, wherein said protective film is formed from an inorganic insulating film.

16. The method as claimed in claim 15, wherein said pixel electrode is formed to cover an area until the side surface of the inorganic insulating film.

17. The method as claimed in claim 9, wherein said protective film is formed from a double layer of an inorganic insulating film and an organic insulating film.

18. The method as claimed in claim 17, wherein said pixel electrode is formed to cover an area until the side surface of the inorganic insulating film.

19. The method as claimed in claim 11, wherein said gate pad upper electrode makes an interface with the protective film.

20. The method as claimed in claim 11, wherein said gate pad upper electrode is coated onto the side surface of the inorganic insulating film when the protective film includes the inorganic insulating film.

21. The method as claimed in claim 12, wherein said data pad upper electrode makes an interface with the protective film.

22. The method as claimed in claim 12, wherein said data pad upper electrode is coated onto the side surface of the inorganic insulating film when the protective film includes the inorganic insulating film.

23. The method as claimed in claim 12, wherein said contact hole is formed to pass through the data pad lower electrode such that the data pad upper electrode makes a side contact with the data pad lower electrode.

24. The method as claimed in claim 9, wherein the protective film including said organic material is formed from at least one of an acrylic organic compound, BCB and PFCB.

25. The method as claimed in claim 9, further comprising the step of:
    removing the organic material protective film making an interface with the crystalline transparent conductive film when the protective film is a built layer of the inorganic material protective film and the organic material protective film.

26. The method as claimed in claim 25, wherein said organic material protective film is made from an organic material including a photosensitive resin.

27. The method as claimed in claim 9, further comprising the step of:
    heating the substrate on which the protective film is formed at a temperature range of about 100° C. to 200° C. while coating the transparent conductive film.

28. The method as claimed in claim 9, wherein said transparent conductive film is formed to have a thickness of about 500 Å or less.

29. The method as claimed in claim 9, wherein said pixel electrode is formed from at least one of ITO, TO, IZO and $SnO_2$.

30. The method as claimed in claim 9, wherein an etching ratio of the amorphous transparent conductive film to the crystalline transparent conductive film is controlled by differentiating a content of an oxalic acid contained in the etchant for amorphous substance.

31. The method as claimed in claim 9, wherein said etchant for amorphous substance contains an oxalic acid at a range of 3 to 5 weight %.

32. The method as claimed in claim 9, wherein said pixel electrode makes a side contact with the drain electrode protruded toward said pixel area.

33. The method as claimed in claim 9, further comprising the step of: forming a crystallization catalyst layer at the remaining area excluding an area where the protective film is formed between said second mask process and said third mask process.

34. The method as claimed in claim 33, wherein said step of forming the protective film includes:

entirely forming the protective film on said substrate; and patterning the protective film by an etching process using a photo-resist pattern formed by the photolithography.

35. The method as claimed in claim 34, wherein said step of forming the crystallization catalyst layer includes:

entirely forming the crystallization catalyst layer on said substrate in which the photo-resist pattern is formed on the protective film; and removing the crystallization catalyst layer on the photo-resist pattern along with the photo-resist pattern.

36. The method as claimed in claim 33, wherein said crystallization catalyst layer is formed such that metal atoms of at least one of refractory metals such as Ni, Cu, In, Sn, Mo, W, Cr and Hf have a distribution scattered on a sparsely basis.

* * * * *